(12) United States Patent
Zhang et al.

(10) Patent No.: US 11,972,817 B2
(45) Date of Patent: Apr. 30, 2024

(54) STATE LOOK AHEAD QUICK PASS WRITE ALGORITHM TO TIGHTEN ONGOING NATURAL THRESHOLD VOLTAGE OF UPCOMING STATES FOR PROGRAM TIME REDUCTION

(71) Applicant: SanDisk Technologies LLC, Addison, TX (US)

(72) Inventors: Ke Zhang, Shanghai (CN); Ming Wang, Shanghai (CN); Liang Li, Shanghai (CN)

(73) Assignee: SanDisk Technologies, LLC, Addison, TX (US)

( * ) Notice: Subject to any disclaimer, the term of this patent is extended or adjusted under 35 U.S.C. 154(b) by 154 days.

(21) Appl. No.: 17/837,903

(22) Filed: Jun. 10, 2022

(65) Prior Publication Data
US 2023/0402110 A1    Dec. 14, 2023

(51) Int. Cl.
*G11C 16/34* (2006.01)
*G11C 16/08* (2006.01)
*G11C 16/10* (2006.01)
*G11C 16/26* (2006.01)

(52) U.S. Cl.
CPC .......... *G11C 16/3459* (2013.01); *G11C 16/08* (2013.01); *G11C 16/102* (2013.01); *G11C 16/26* (2013.01); *G11C 16/3404* (2013.01)

(58) Field of Classification Search
CPC ... G11C 16/3459; G11C 16/08; G11C 16/102; G11C 16/26; G11C 16/3404
USPC ..................................................... 365/185.22
See application file for complete search history.

(56) References Cited

U.S. PATENT DOCUMENTS

| | | | |
|---|---|---|---|
| 8,274,838 B2 | 9/2012 | Dutta et al. | |
| 9,437,302 B2 | 9/2016 | Tseng et al. | |
| 9,620,238 B2 | 4/2017 | Khandelwal et al. | |
| 10,014,063 B2* | 7/2018 | Tseng | G11C 16/10 |
| 10,748,622 B2* | 8/2020 | Lin | G11C 16/10 |
| 2017/0125087 A1 | 5/2017 | Masuduzzaman et al. | |
| 2020/0066351 A1* | 2/2020 | Wong | G11C 11/5628 |

(Continued)

OTHER PUBLICATIONS

U.S. Appl. No. 17/343,179, Memory Apparatus and Method of Operation Using Dynamic Max Program Loop, Parth Amin et al., filed Jun. 9, 2021.

*Primary Examiner* — Huan Hoang
(74) *Attorney, Agent, or Firm* — Dickinson Wright PLLC; Steven C. Hurles

(57) ABSTRACT

A memory apparatus and method of operation are provided. The apparatus includes memory cells connected to word lines. The memory cells are disposed in strings and are configured to retain a threshold voltage corresponding to data states. A control means is configured to apply verification pulses of program verify voltages each associated with one of the data states to selected ones of the word lines to determine whether the memory cells connected thereto have the threshold voltage above each of the program verify voltages associated with the data states targeted for each of the memory cells being programmed during verify loops of a program-verify operation. The control means slows the memory cells targeted for a selected one of the data states identified as being faster to program than other ones of the memory cells during one of verify loops associated with an earlier one of data states.

20 Claims, 23 Drawing Sheets

(56) References Cited

U.S. PATENT DOCUMENTS

2020/0365220 A1* 11/2020 Yang .................. G11C 16/3486
2021/0193226 A1    6/2021 Li et al.
2021/0407605 A1   12/2021 Lien et al.

* cited by examiner

| CELL | TDL | SDL |
|---|---|---|
| PROGRAM CELLS | 0 | 0 |
| S$_X$LAQPW OR QPW CELLS | 1 | 0 |
| INHIBIT CELLS | 1 | 1 |
| "S$_X$LAQPW+QPW" CELLS | 0 | 1 |

| ADD=XXh | | | | | | | | F_SLAQPW_EN | |
|---|---|---|---|---|---|---|---|---|---|
| [7] | [6] | [5] | [4] | [3] | [2] | [1] | [0] | OPTION | |
| | | | | | 0 | 0 | 0 | DISABLE SLAQPW | |
| | | | | | 0 | 0 | 1 | ENABLE S$_1$LAQPW | |
| | | | | | 0 | 1 | 0 | ENABLE S$_2$LAQPW | |
| | | | | | 0 | 1 | 1 | ENABLE S$_3$LAQPW | |
| | | | | | 1 | 0 | 0 | ENABLE S$_4$LAQPW | |
| | | | | | 1 | 0 | 1 | ENABLE S$_5$LAQPW | |
| | | | | | 1 | 1 | 0 | ENABLE S$_6$LAQPW | |

*FIG. 19*

| PROGRAM LOOP # STATE | P_#1 | P_#2 | P_#3 | P_#4 | P_#5 | P_#6 | P_#7 | P_#8 | P_#9 | P_#10 | P_#11 | P_#12 |
|---|---|---|---|---|---|---|---|---|---|---|---|---|
| S1 | V_#1 SLAQPW_S2 | V_#2 SLAQPW_S2 | | | | | | | | | | |
| S2 | | | V_#3 | V_#3 | | | | | | | | |
| S3 | | | V_#2 SLAQPW_S3 | V_#2 SLAQPW_S4 | V_#3 | | | | | | | |
| S4 | | | | | V_#1 SLAQPW_S5 | V_#2 SLAQPW_S5 | V_#3 | | | | | |
| S5 | | | | | | V_#4 | V_#2 SLAQPW_S6 | V_#3 | V_#4 | | | |
| S6 | | | | | | | | V_#1 SLAQPW_S7 | V_#2 SLAQPW_S6 | V_#3 | V_#3 | |
| S7 | | | | | | | | | | V_#2 | V_#3 | V_#4 |

*FIG. 20*

STATE LOOK AHEAD QUICK PASS WRITE ALGORITHM TO TIGHTEN ONGOING NATURAL THRESHOLD VOLTAGE OF UPCOMING STATES FOR PROGRAM TIME REDUCTION

FIELD

This application relates to non-volatile memory apparatuses and the operation of non-volatile memory apparatuses.

BACKGROUND

This section provides background information related to the technology associated with the present disclosure and, as such, is not necessarily prior art.

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. Memory devices always strive for improved efficiency and speed of operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines. The memory cells are disposed in strings and are configured to retain a threshold voltage corresponding to one of a plurality of data states. A control means is coupled to the plurality of word lines and the strings and is configured to apply verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation. The control means is also configured to slow the memory cells targeted for a selected one of the plurality of data states identified as being faster to program than other ones of the memory cells targeted for the selected one of the plurality of data states during one of the plurality of verify loops associated with an earlier one of the plurality of data states. The selected one of the plurality of data states corresponds to the threshold voltage of the memory cells being higher than for the earlier one of the plurality of data states.

According to another aspect of the disclosure, a controller in communication with a memory apparatus including memory cells connected to one of a plurality of word lines is also provided. The memory cells are disposed in strings and are configured to retain a threshold voltage corresponding to one of a plurality of data states. The controller is configured to instruct the memory apparatus to apply verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation. The controller is also configured to instruct the memory apparatus to slow the memory cells targeted for a selected one of the plurality of data states identified as being faster to program than other ones of the memory cells targeted for the selected one of the plurality of data states during one of the plurality of verify loops associated with an earlier one of the plurality of data states, the selected one of the plurality of data states corresponding to the threshold voltage of the memory cells being higher than for the earlier one of the plurality of data states.

According to an additional aspect of the disclosure a method of operating a memory apparatus is provided. The memory apparatus includes memory cells connected to one of a plurality of word lines is also provided. The memory cells are disposed in strings and are configured to retain a threshold voltage corresponding to one of a plurality of data states. The method includes the step of applying verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation. The method also includes the step of slowing the memory cells targeted for a selected one of the plurality of data states identified as being faster to program than other ones of the memory cells targeted for the selected one of the plurality of data states during one of the plurality of verify loops associated with an earlier one of the plurality of data states, the selected one of the plurality of data states corresponding to the threshold voltage of the memory cells being higher than for the earlier one of the plurality of data states.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 19 is a table showing one parameter that can be used to determine whether to enable the SLAQPW process or algorithm according to aspects of the disclosure;

FIG. 20 shows an exemplary program-verify waveform table for TLC programming with the $S_1$LAQPW algorithm according to aspects of the disclosure.

DETAILED DESCRIPTION

Figure 1:
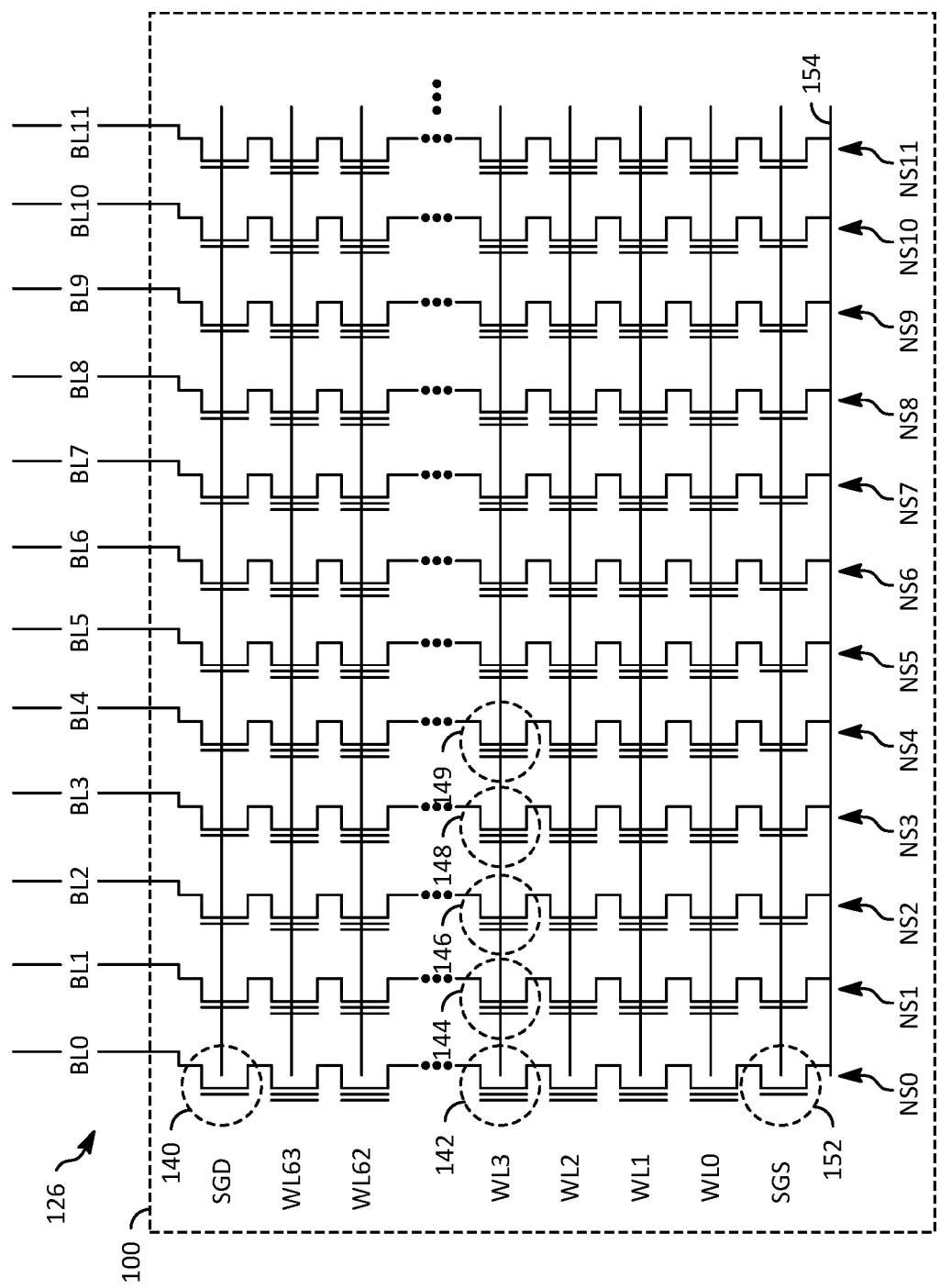
FIG. 1 illustrates an embodiment of an array of memory cells including bit and word lines according to an example embodiment.

Systems and methods are described for controlling the program operations of nonvolatile memory to improve speed of operation by counting the number of memory cells that verify for a particular state and then trigger the next state verify. This can be done without performing another program signal or a voltage level ramp down. In an example embodiment, the system or method of the present disclosure can trigger the next state verify within the same program loop. This can be triggered when the count of the upper tail bits is larger than a threshold value that can be stored on die. In an example embodiment, the memory may not enact the voltage level ramp down with the upper tail bit counts above the threshold value. The memory will enact the voltage level ramp down (e.g., during the RR phase of program verify) after the program verify for a state with the bits in the upper tail being below the threshold value.

A programming operation for a group of memory cells typically involves providing the memory cells in an erased state and then applying a series of program pulses to the memory cells. Each program pulse is provided in a program loop, also referred to as a program-verify iteration. For example, the program pulse may be applied to a word line that is connected to control gates of the memory cells. In one approach, incremental step pulse programming is performed, in which the program pulse amplitude is increased by a step size in each program loop. Verify operations may be performed after each program pulse to determine whether the memory cells have completed programming. When programming has completed for a memory cell, the memory cell can be locked out from further programming while programming continues for other memory cells in subsequent program loops.

Each memory cell may be associated with a memory state according to write data in a program command. As used herein, a "memory state" is a detectable characteristic of a memory cell (e.g., a threshold voltage of a NAND memory cell, a resistance of a ReRAM memory cell, a magnetization state of a magnetoresistive random access memory) that may be used to represent a data value, such as a binary data value, including more than one binary bit. As used herein, the detectable characteristic of a memory cell used to represent a data value is referred to as a "programming characteristic." Based on write data in a program command, a memory cell will either remain in the erased state or be programmed to a memory state (a programmed memory state) different from the erased state.

For example, in a two-bit per cell memory device, there are four memory states including the erased state and three programmed memory states. In a three-bit per cell memory device, there are eight memory states including the erased state and seven programmed memory states. In a four-bit per cell memory device, there are sixteen memory states including the erased state and fifteen programmed memory states.

When a program command is issued, the write data are stored in data latches associated with the memory cells. For example, in a two-bit per cell memory device, each memory cell is associated with two data latches (e.g., DL1, DL2) that store the two-bit write data for the memory cell. Likewise, in a three-bit per cell memory device, each memory cell is associated with three data latches (e.g., DL1, DL2, DL3) that store the three-bit write data for the memory cell. Similarly, in a four-bit per cell memory device, each memory cell is associated with four data latches (e.g., DL1, DL2, DL3, DL4) that store the four-bit write data for the memory cell. Examples of data latches can be found in U.S. Pat. No. 10,535,401, which is incorporated by reference herein.

During programming, the data latches of a memory cell can be read to determine the memory state to which the cell is to be programmed. For NAND memory cells, each programmed memory state is associated with a verify voltage. A NAND memory cell with a given memory state is considered to have completed programming when a sensing operation determines the threshold voltage (Vth) of the memory cell is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

In addition to the verify operations described above, a bitscan operation also may be performed to determine when programming is complete for a group of memory cells. As used herein, a "bitscan" is an operation that counts a number of memory cells whose programming characteristic has not shifted above a particular verify voltage level for a particular memory state. For NAND memory cells, a bitscan is an operation that counts a number of memory cells whose threshold voltage has not shifted above a particular verify voltage level for a particular memory state. For example, a state N bitscan is a count of a number of state N memory cells whose threshold voltage has not shifted above a verify voltage level for state N. Likewise, a state (N+1) bitscan is a count of a number of state (N+1) memory cells whose threshold voltage has not shifted above a verify voltage level for state (N+1), and so on. For simplicity, the following discussion will refer to bitscan operations for NAND memory cells. Persons of ordinary skill in the art will understand that bitscan operations also may be used for other non-volatile memory technologies. According to embodiments of the present disclosure these bitscan counts to trigger the verify operation to skip to the next program level in the same programming loop.

Programming of memory cells for a particular memory state may be considered complete if the bitscan count for a particular state is less than a predetermined value. In some embodiments, the predetermined value is less than a number of read errors that can be corrected by an error correction code engine. In other words, programming of memory cells for a particular memory state may be considered complete even though all memory cells that are to be programmed to the particular memory state do not have threshold voltages that have shifted above a verify voltage level for the memory state, as long as the number of "failing" memory cells is less than a number of read errors that can be corrected by an error correction code engine. Moreover, the count of the bitscan can be used to trigger a skip to the next memory state verify operation.

Bitscan calculations typically are performed based on results of verify operations for a particular program-verify iteration. In particular, following application of a program pulse, verify operations may be performed for one or more memory states, and then results of the verify operations may be used to calculate the bitscan for a particular memory state.

In some programming techniques, following each program pulse, a bitscan is performed for a single memory state (a "single-state bitscan"), and bitscans for higher memory states are not performed until the bitscan count for the lower memory state is less than the threshold value. Under some circumstances, performing such single-state bitscans may result in extra verify operations being performed and extra program pulses being applied to the memory cells, even though the memory cells have actually completed programming. This is undesirable because time is consumed performing verify operations, and applying unnecessary program pulses may cause over program.

In other programming techniques, following each programming pulse, a bitscan is performed for multiple (e.g., n) consecutive memory states (an "n-state bitscan"). Under some circumstances, performing such n-state bitscans also may result in extra verify operations being performed and extra program pulses being applied to the memory cells, even though the memory cells have actually completed programming. As in the case of single-state bitscans, this is undesirable because time is consumed performing verify operations, and applying unnecessary program pulses may cause over program. Technology is described herein which can perform a state look ahead quick pass write (SLAQPW) algorithm to shorten program time tProg by reducing a total number of verify pulses.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magneto-resistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
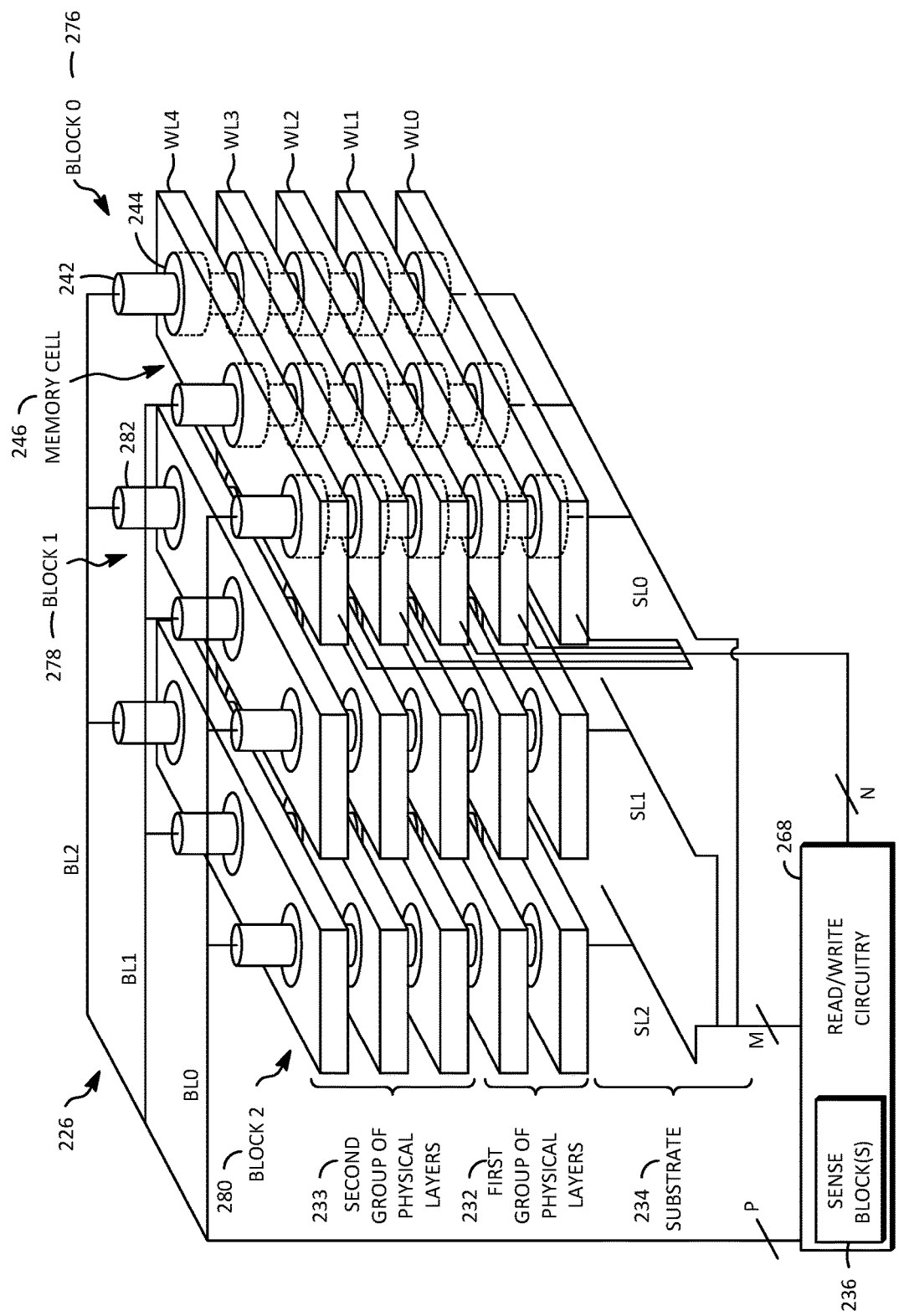
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 (which can be part of a controller) is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIGS. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 226 can also perform verify operations as part of the programming operation.

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
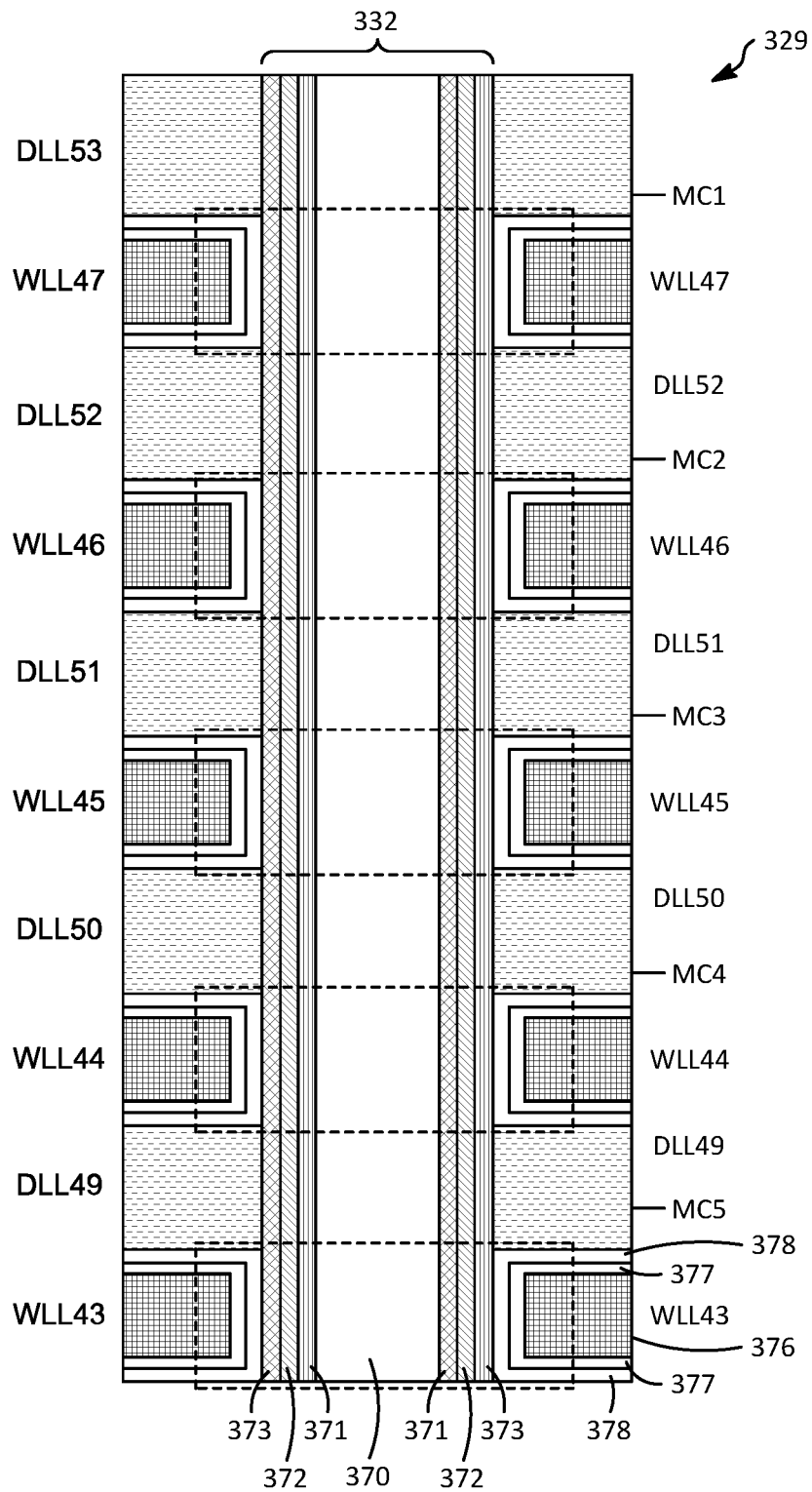
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes 48 storage cells.

Figure 4:
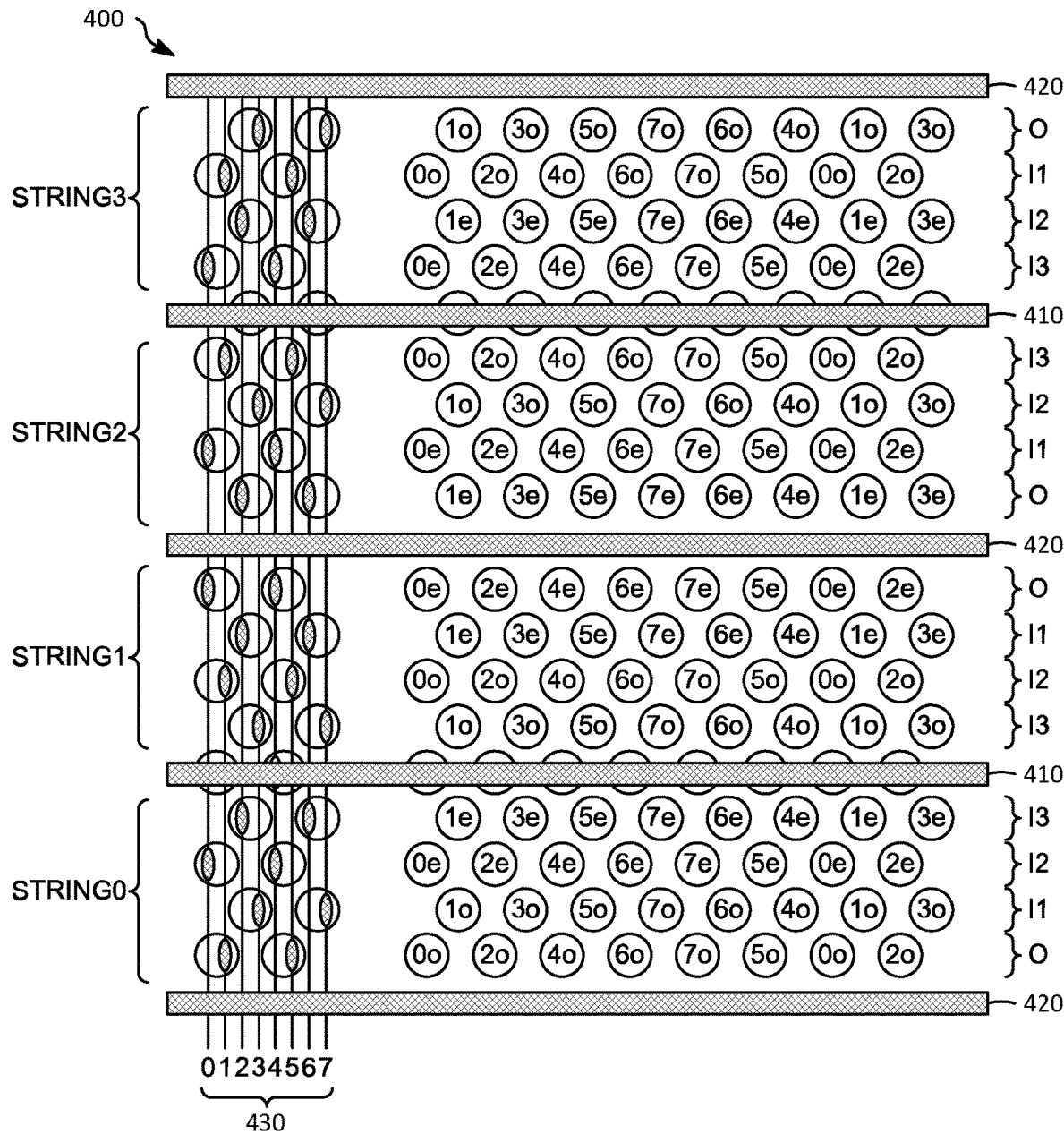
FIG. 4 illustrates a diagram showing a top view of a 3D memory block according to an example embodiment.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "0," "I1," "I2," and "I3" in FIG. 4). Each IO group is located between two different types of etching features formed in the 3D memory block 400, a shallow etching feature 410 (e.g., called SHE), and a deep etching feature 420 (e.g., called ST). The IO groups adjacent to a deep etching feature 420 are labeled outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each. These smaller groups can be arranged in tiers. The tiers can include the memory cells associated with the holes designated by the same designated circles in FIG. 4. The memory cells labeled as 2o are part of a same tier. The memory cells labeled 3e are part another tier. The memory cells labeled as 2e are part of a same tier. The memory cells labeled 3o are part another tier. As explained herein the controller can select a single tier for a program verify operation when the program verify level is unlikely to find an overprogrammed state or when the single tier is representative of the other tiers. At least one intermediate level for program verify is a multiple tier verify operation.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
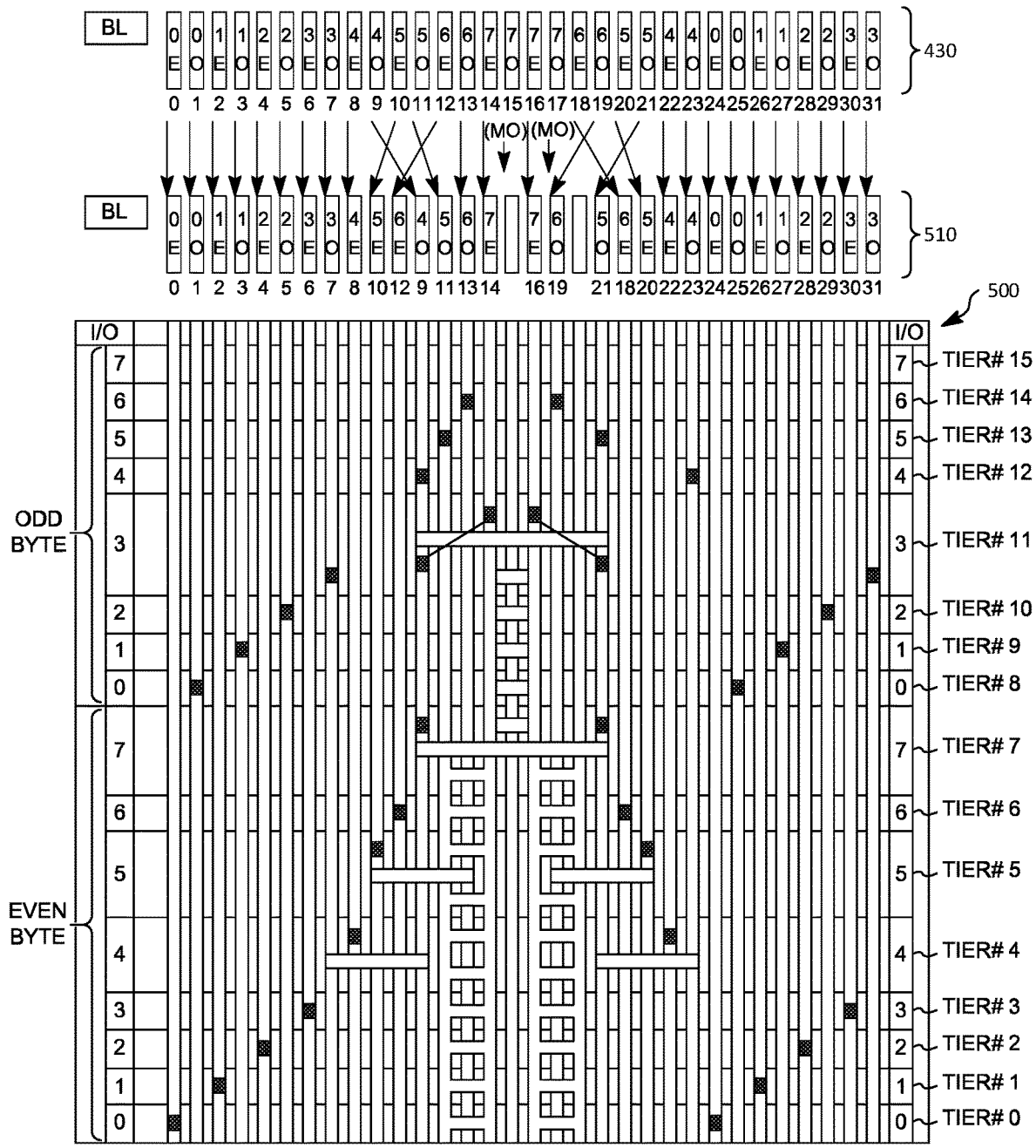
FIG. 5 illustrates an array of sense amplifier groups according to an exemplary embodiment for the 3D memory block of FIG. 4.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier #0 to Tier #15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like.

Figure 6:
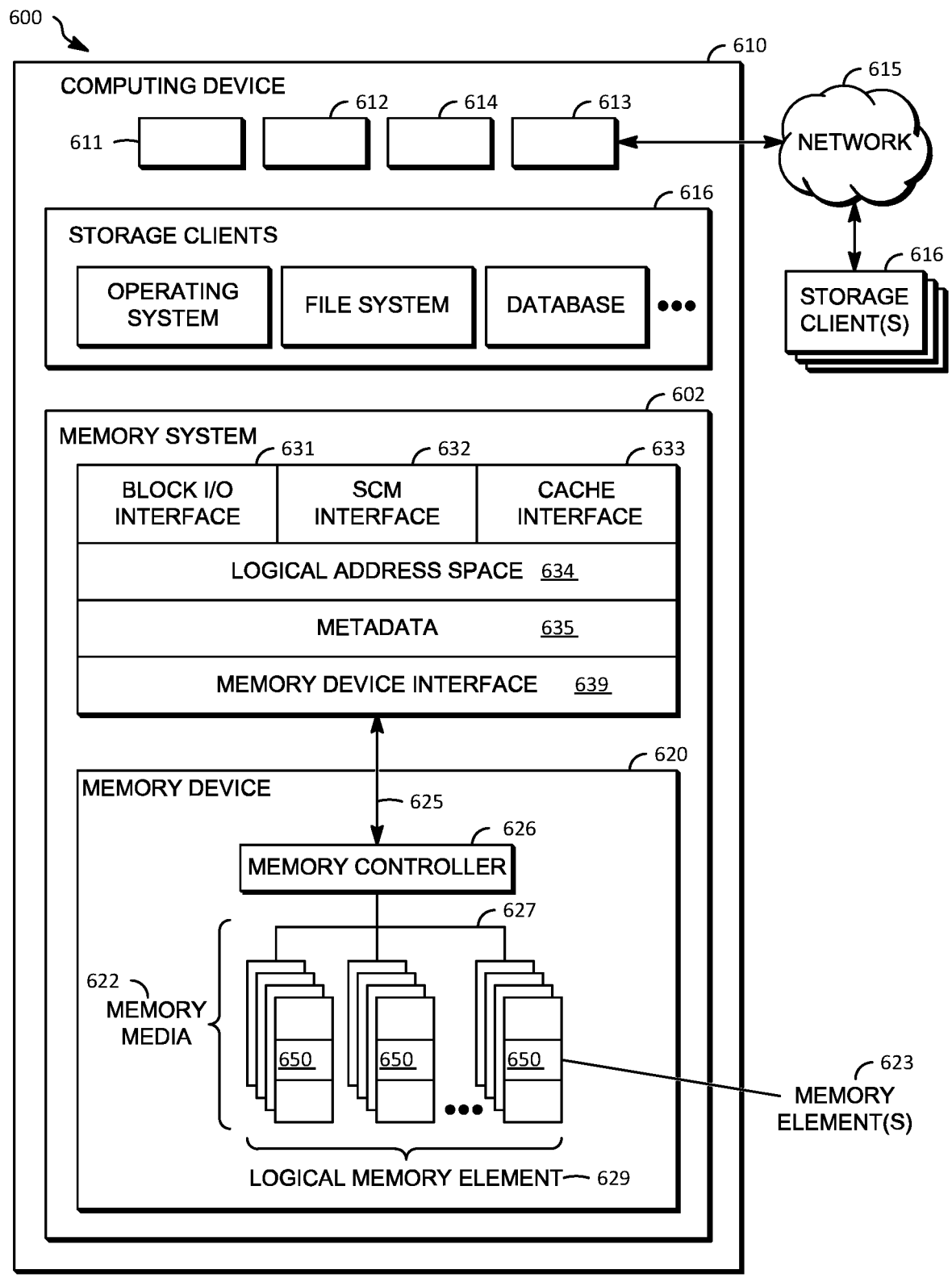
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. The computing device 610 comprises one or more identification circuits or tier selection circuits 650 for memory media 622 of a non-volatile and/or volatile memory device 620. As used herein, an "tier circuit" refers to a circuit utilized to identify a particular tier of memory cells (e.g., a 2o tier memory cells) in relation to at least one other subgroup or tier of memory cells and select the identified tier of memory cells for use in at least one programming operation, e.g., program verify. The tier selection circuits can operate to select a single tier for some program verify levels and multiple tiers for other program verify levels in a same verify operation. At least one verify is a single tier verify, e.g., the A or first program verify level. The first program verify level can be the lowest voltage. In an example embodiment, the last program verify level is also a single tier verify operation. In an example embodiment, at least one intermediate program verify is performed on multiple tiers.

A tier selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626 can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an I node, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device(s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, Infmiband, SCSI RDMA, or the like. The memory device interface 639 can communicate with the one or more memory devices 620 using inputoutput control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620. Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
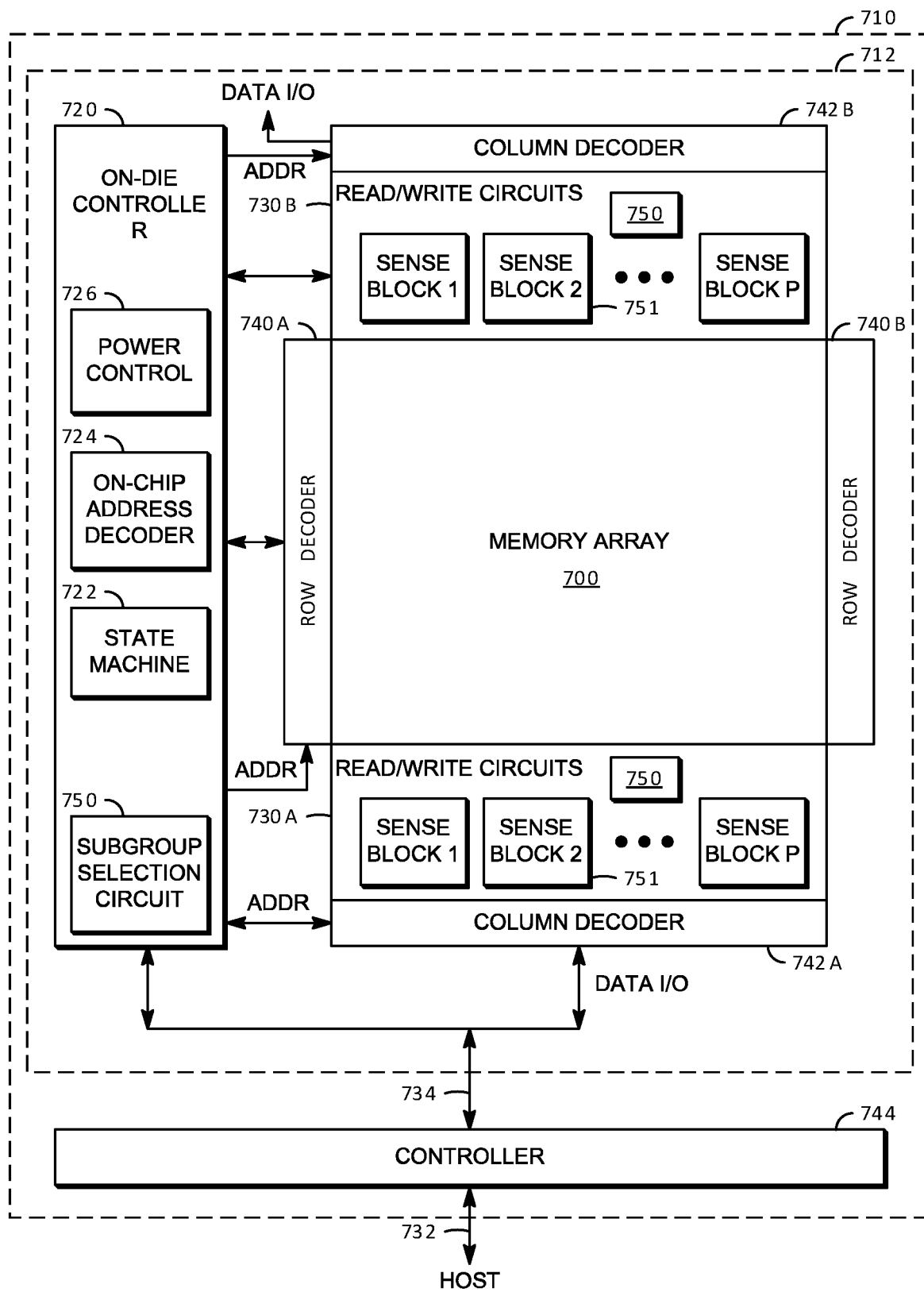
FIG. 7 illustrates a schematic block diagram of non-volatile storage device for memory cell subgroup identification and selection.

FIG. 7 is a schematic block diagram illustrating an embodiment of a non-volatile storage device 710, which can perform programming and verify operations as described herein. The non-volatile storage device 710 can include one or more memory die or chips 712A "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, and a power control circuit 726. In one embodiment, the on-chip address decoder 724 and/or the power control circuit 726 can be part of and/or controlled by the controller 744. The on-die controller c720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage. The state machine can be used to count the bitscans and compare the result to the threshold value, which can be stored in the state machine. The state machine can also trigger the program verify operation to skip to the next memory level verify operation when the bitscan count exceeds the threshold value.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730 A, read/write circuits 730B, and/or controller 744 can be referred to as one or more managing circuits or generally as a controller circuitry.

Figure 8:
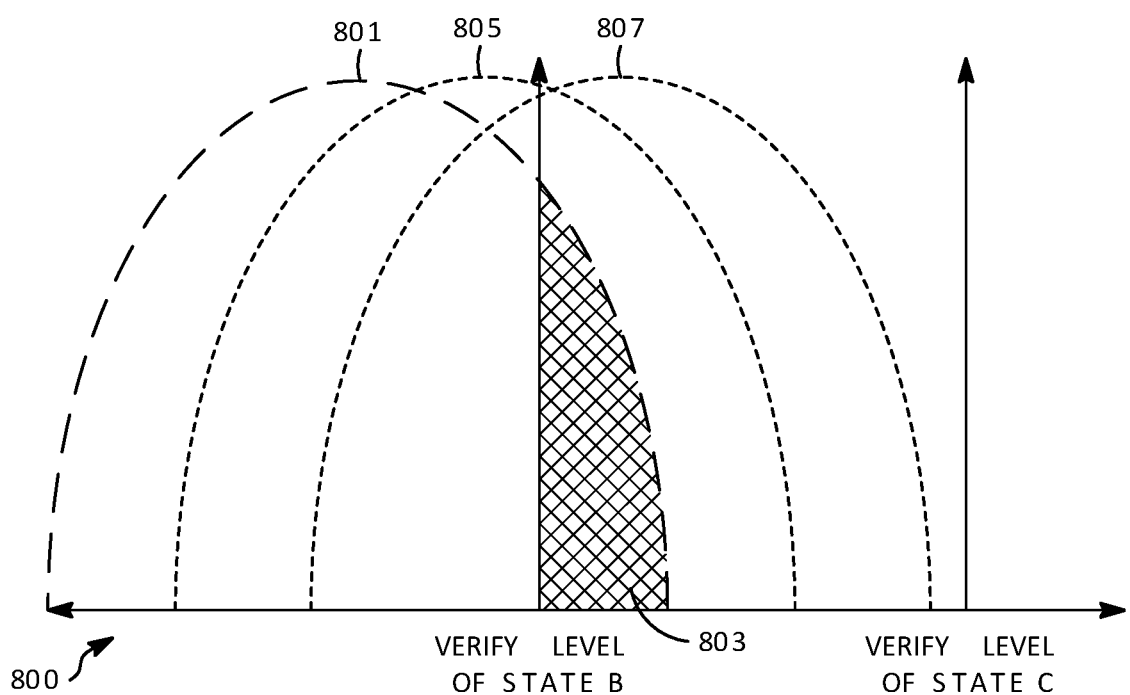
FIG. 8 illustrates a program verify operation according to an example embodiment.

FIG. 8 shows a diagram 800 with a threshold voltage (Vt) distribution during the middle of program operation and verifying a first memory state, here shown as the State B, and a second memory state, here state C. While the states B and C are used to illustrate the present concept, it will be recognized that the other consecutive states can also use similar principals. Voltage is represented on the abscissa.

In NAND memory, the logical value stored in a memory cell is determined by the voltage window in which the cell's Vt lies. The Vt is the voltage stored in a cell after the program pulse. As cell size is scaled down and more bits per cell are stored, the threshold voltage window used to represent each value becomes smaller, leading to increased error rates in determining a cell's value. This is because process variations become more prevalent when the amount of charge stored in a flash cell reduces with feature size, leading to the Vt of different cells storing the same value becoming significantly different. Hence, deciding what logical value to which a cell's threshold voltage corresponds is becoming increasingly difficult while it is necessary for reliability.

After respective program pulses are applied to the memory cells, the operation of the memory performs a verification step which can detect the distribution of the voltages stored in the memory cells. Each memory state (e.g., A-G states) has its own Vt, which increases with each successive state. The Vt distribution 801 results from a first program pulse being applied to the memory cells and shows the bitscan count of the number of memory cells as function of voltage. An upper tail of the distribution 801 includes some scanned bits (memory cells) that exceed the voltage verify level of State B. This is represented in area 803 to the right of the voltage verify level of State B. If the bitscan count in area 803 does not exceed a threshold value, then the memory system will apply the next program pulse, which will result in the distribution 805. If the bitscan count in area 803 meets or exceeds a threshold value, then the memory system will trigger the program verify pulse for C state, which results in bit scan distribution 805. No prior program verify have been applied for C state before triggering, which saves several program verify count and be known as smart skip program verify. This subsequent program pulse and verify will result in the distribution 807 beyond distribution 805 (at a higher voltage). In an example embodiment, when a Vt distribution at certain memory cell state, e.g., any of A through F states, then verify process can trigger the verify for next voltage level in the same verify process without triggering the next program pulse. In an example embodiment, the verify process counts bits to the right of the Vt of state B and triggers the verify for C state occurs in the same verify loop as the sensing of the bits that exceed the Vt of the B state.

During a program verify operation in the memory, an example embodiment typically performs a program verify of all states, e.g., A-G states, along a set scheme. See, e.g., FIG. 10A of U.S. Pat. No. 10,014,063, which is hereby incorporated by reference in its entirety. In some practical applications, performing verify of the C to G states after a first program pulse can be a waste of time and resources. Therefore, smart skip program verify detects when an upper tail of a lower state (e.g., A or B state) is above some threshold value and triggers the program verify for the next higher state prior to starting a next program/verify loop. This can reduce unnecessary program/verify loop for the higher state at subsequent program loop. In order to trigger the next state verify, there is a pre-defined bit count in the memory circuitry and during the program operation, when the bit scan result shows that upper tail has a higher bit count compared to a stored threshold value (or reaches the threshold value), the methodology triggers the next state verify after next program pulse.

The smart skip program verify operation detects the upper tail of "n" state and determines if triggering n+1 state verify based on the threshold value. The threshold value can be set based on statistical analysis of the memory device. If is desirable to determine when to skip to the next state (n+1) from the current state (n) being verified as even using the minimum voltage increase of the programming voltage, the earliest program verify initiates on the next loop (n+1 loop) instead of the current loop (n) can result in an over programming.

Figure 9A:
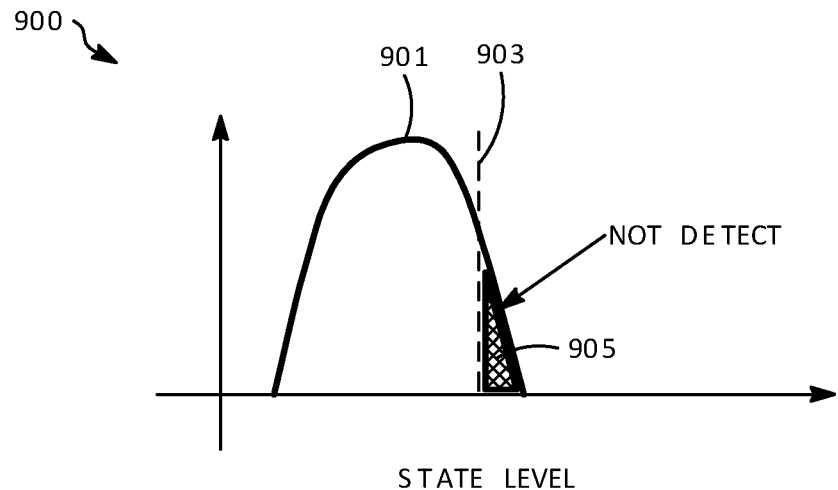
FIG. 9A illustrates a program verify operation that does not detect a bitcount above a threshold according to an example embodiment.

FIG. 9A shows a diagram 900 that includes a threshold voltage distribution 901, i.e., bitscan counts, from a verify operation. This is used to verify the programmed bit values stored in the addressed memory cells at the state verify level 903. The area 905 to the right of the voltage level and under the curve of the verify pulse 901 (its upper tail) is the count of bitscans (i.e., the count of memory cells whose voltage exceeds the state voltage level). The area 905 does not show enough count to exceed the threshold value to trigger a skip to the next state level in the same verify iteration.

Figure 9B:
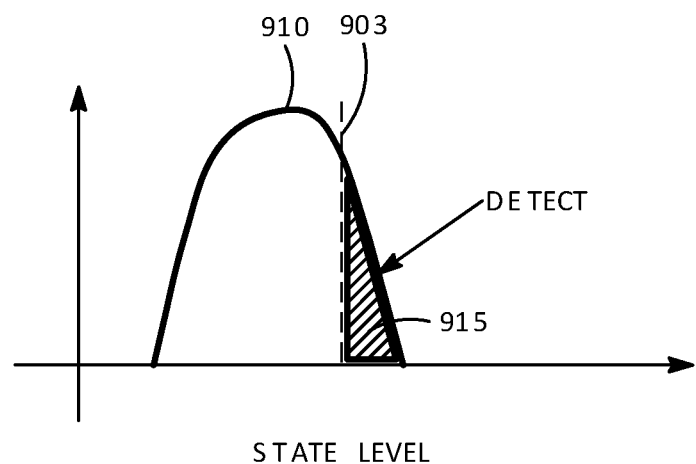
FIG. 9B illustrates a program verify operation that detect a bitcount above a threshold according to an example embodiment.

FIG. 9B shows a diagram that includes threshold voltage distribution 910, i.e., bitscan counts, from a verify operation. This is used to verify the programmed bit values stored in the addressed memory cells at the state level 903. The area 915 to the right of the voltage level and under the curve of the verify pulse 910 (e.g., the upper tail of distribution 910) is the count of bitscans (i.e., the number of memory cells whose voltage exceeds the state voltage level). The area 905 does show enough count to exceed the threshold value and trigger a program verify to the next state level in the same verify iteration. In an example embodiment, the methodology, will trigger a verify before applying the next program pulse.

Figure 10A:
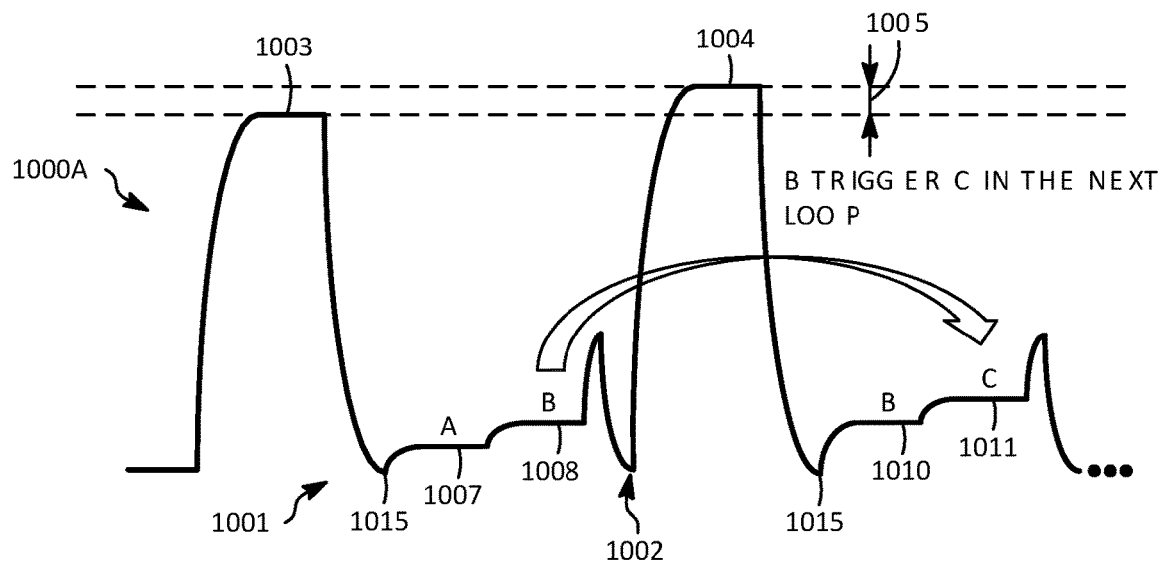
FIG. 10A illustrates a voltage levels in program verify iterations according to an example embodiment.

FIG. 10A shows a program verify operation 1000A with two program verify iterations. The operation 1000A is a partial example of a memory cell programming operation for a multi-state memory device having an erased state (Er) and three programmed memory states (e.g., A, B, C). The horizontal axis depicts time. The vertical axis depicts control gate or word line voltage. Generally, a programming operation can involve applying a pulse train to a selected word line, where the pulse train includes multiple program loops or program-verify iterations. The program portion of the program-verify iteration includes a Vpgm pulse (voltage pulses 1003 or 1004), and the verify portion of the program-verify iteration includes one or more verify pulses (e.g., voltage pulses 1007, 1008 or voltage pulses 1010, 1011).

For each Vpgm pulse 1003, 1004, a square waveform is depicted for simplicity, although other shapes are possible such as a multilevel shape or a ramped shape. Further, Incremental Step Pulse Programming (ISPP) is used in this example, in which the Vpgm pulse amplitude steps up in each successive program loop shown as the voltage increase 1005. This example uses ISPP in a single programming pass in which the programming is completed. ISPP also can be used in each programming pass of a multi-pass operation.

A pulse train typically includes Vpgm pulses which increase stepwise in amplitude by in each program-verify iteration using a fixed or varying step size, e.g., voltage step 1005. A new pulse train starts at an initial Vpgm pulse level (for e.g., for an A level) and ends at a final Vpgm pulse level (e.g., at a G level for a three bits multi-level memory) which does not exceed a maximum allowed level.

Operation 1000A includes a series of Vpgm pulses 1003, 1004 that are applied to a word line selected for programming, and an associated set of non-volatile memory cells. One, two or three verify voltage pulses are provided after each Vpgm pulse as an example, based on the target memory states which are being verified. A voltage of 0V (here shown at 1015) may be applied to the selected word line between the Vpgm pulses 1003, 1004 and verify voltage pulses 1007, 1008 and 1010, 1011.

In an embodiment, A-state verify voltage VvA (e.g., waveform or signal 1007) may be applied after the first Vpgm pulse 1003. The B-state verify voltage VvB (e.g., waveform or signal 1008) may be applied after the waveform 1007. The bitscan occurs to count the number of memory cells that exceed the B-state level. This is the operation shown and described with reference to FIG. 9B. As the bitscan count exceeds a threshold value, the memory controller triggers the operation 1000A in the next iteration 1002 to trigger the C-state level verify signal 1001.

The next iteration 1002 increases the Vpgm pulse 1004 by voltage 1005 from the first program pulse 1003. The signal level is dropped to about zero volts and then the B-state and C-state program verify pulses 1010, 1011 are applied. B-state verify voltage VvB (e.g., waveform or signal 1010) may be applied after the second Vpgm pulse 1003. The C-state verify voltage VvC (e.g., waveform or signal 1011) may be applied after the waveform 1010. Thus, the bitcount of the B-state triggered the verify of the C-state in a subsequent verify iteration.

Figure 10B:
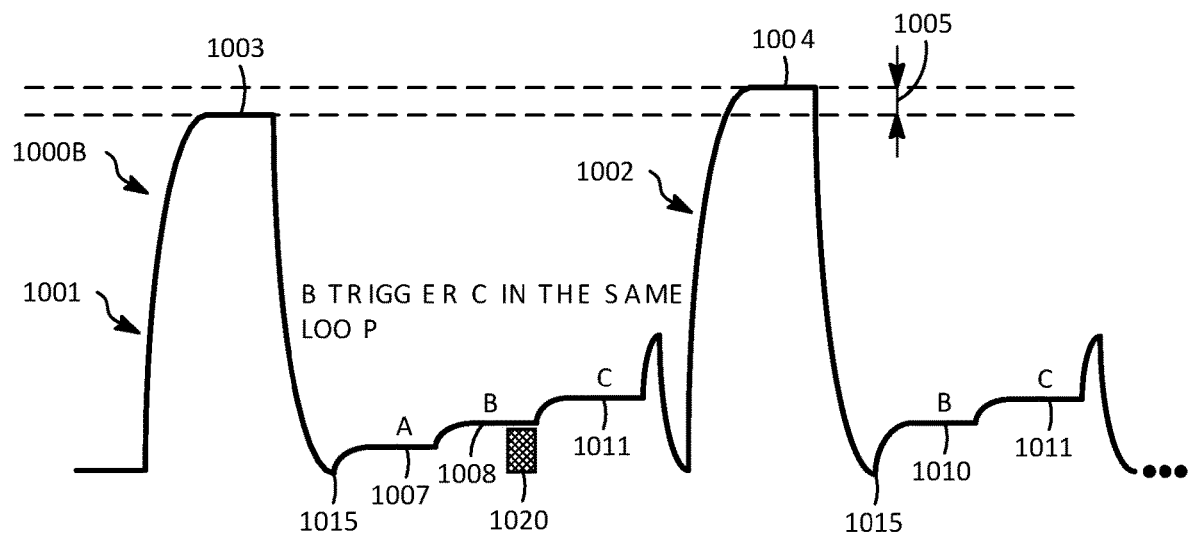
FIG. 10B illustrates a voltage levels in program verify iterations according to an example embodiment.

FIG. 10B shows a program operation 1000B, which is similar to operation 1000A with same signal, e.g., voltage levels, being designated with the same reference numbers as in FIG. 10A. However, there is a difference. When the bitcount from the bitscan occurring at the B-state, e.g., based on signal 1008, it triggers the operation 1000B to conduct the C-level verify in the same iteration. That is, the C-level verify is performed in the same iteration as the preceding B-state that exceeded the threshold value for the bitscan count. The initial C-level verify occurs before the incremented program signal 1004. This is schematically shown at box 1020 whereat the bitscan count of B-state occurs and the memory controller detects that the count threshold is met or exceeded. The memory controller then applies the next verify state level before proceeding to the iteration 1002.

While the above example uses the A-state, the B-state, and the C-state for illustrative purposes, it is within the scope of additional embodiments to apply the same determination of the bitscan count meeting or exceeding the count threshold to trigger the verification of the next state. For example, the C-state can trigger the D-state verify in the same iteration. The D-state bitscan count determination can trigger the E-state verify in the same iteration. The E-state bitscan count determination can trigger the F-state verify in the same iteration. The F-state bitscan count determination can trigger the G-state verify in the same iteration.

Figure 10C:
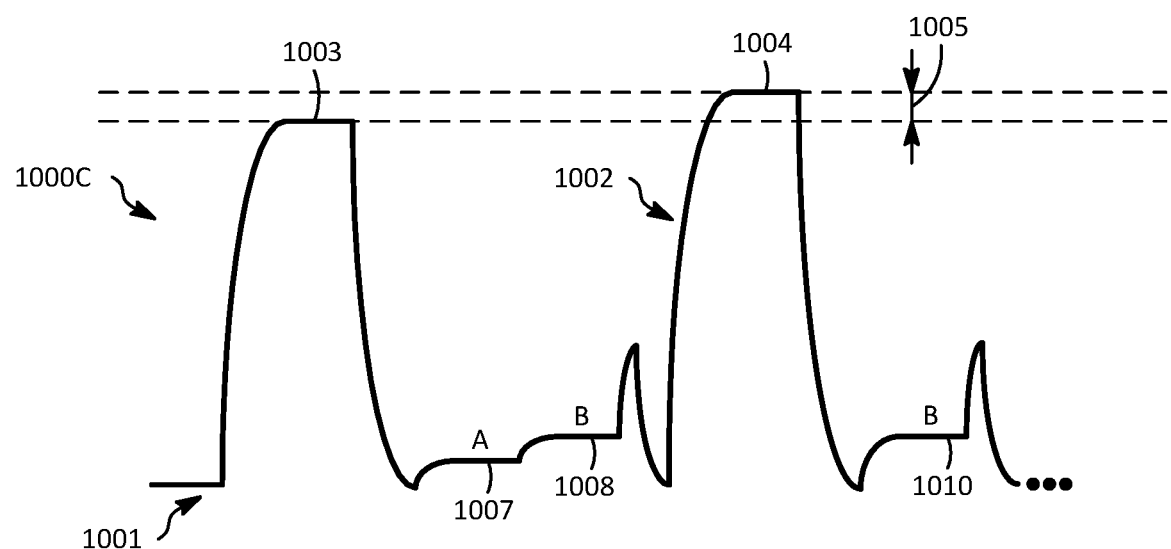
FIG. 10C illustrates a voltage levels in program verify iterations according to an example embodiment.

FIG. 10C shows a program and verify operation 1000C that is similar to FIGS. 9A and 9B, and the same elements are designated with the same reference numbers. However, this operation 1000C is when the bitscan count for the B-state does not exceed or meet the threshold value. This is the operation 1000C that results from the embodiment shown in FIG. 9A. The C-state is not triggered early by a count in the first iteration and thus is not in the second iteration 1002 or triggered in the first iteration 1001.

Figure 11A:
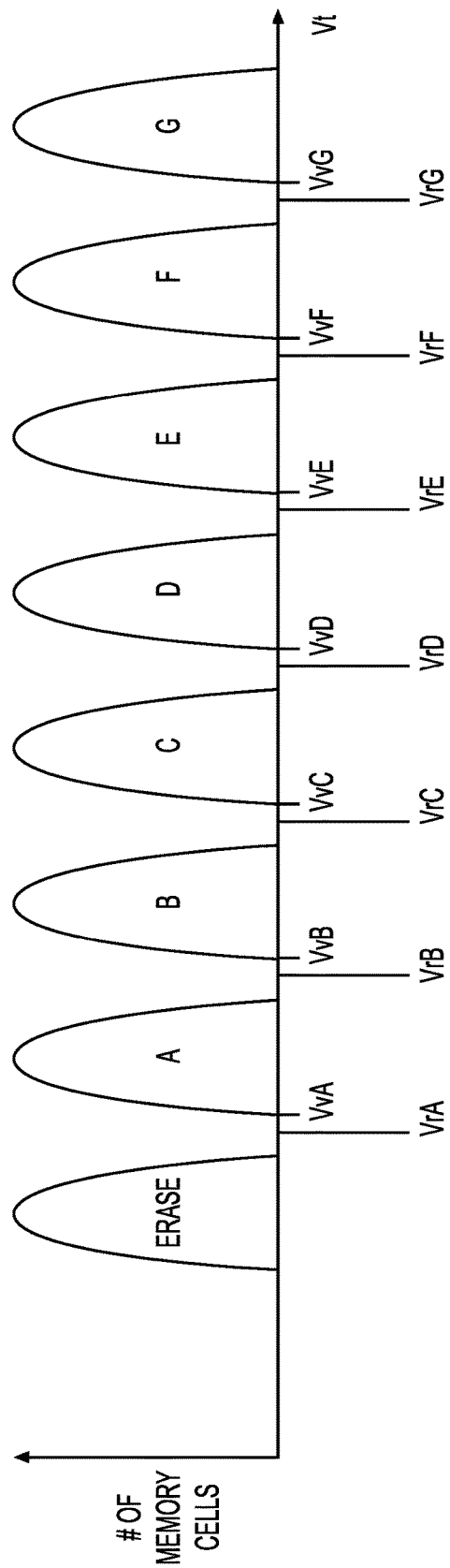
FIG. 11A depicts an example set of Vt distributions according to aspects of the disclosure.

At the end of a successful programming process (with verification), the threshold voltages of the memory cells should be within one or more distributions of threshold voltages for programmed memory cells or within a distribution of threshold voltages for erased memory cells, as appropriate. FIG. 11A illustrates example Vt distributions corresponding to data states for the memory cell array when each memory cell stores three bits of data. Other embodiment, however, may use more or fewer than three bits of data per memory cell. FIG. 11A shows eight Vt distributions corresponding to an Erase state and programmed states A-G. In one embodiment, the threshold voltages in the Erase state are negative and the threshold voltages in the programmed states A-G are positive.

However, the threshold voltages in one or more of programmed states A-G may be negative. Thus, in one embodiment, at least VrA is negative. Other voltages such as VvA, VrB, VvB, etc., may also be negative.

Between each of the data states are read reference voltages used for reading data from memory cells. For example, FIG. 11A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 11A shows VvA for the A-state and VvB for the B-state. When programming memory cells to a given state, the system will test whether those memory cells have a threshold voltage greater than or equal to the verify reference voltage.

Figure 11B:
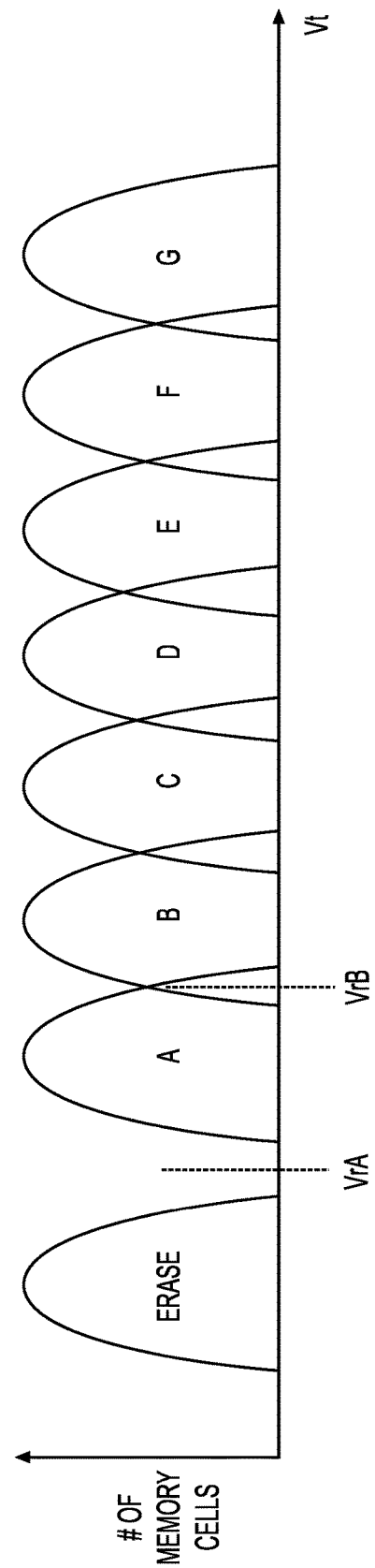
FIG. 11B depicts an example set of Vt distributions according to aspects of the disclosure.

FIG. 11B illustrates that Vt distributions can partially overlap since the error correction algorithm can handle a certain percentage of cells that are in error. Note that in some embodiments, at one point in time the threshold voltage distribution may resemble FIG. 11A and at another time the threshold voltage distributions may overlap, as in FIG. 11B. For example, just after programming, the threshold voltage distribution may resemble FIG. 11A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 12A:
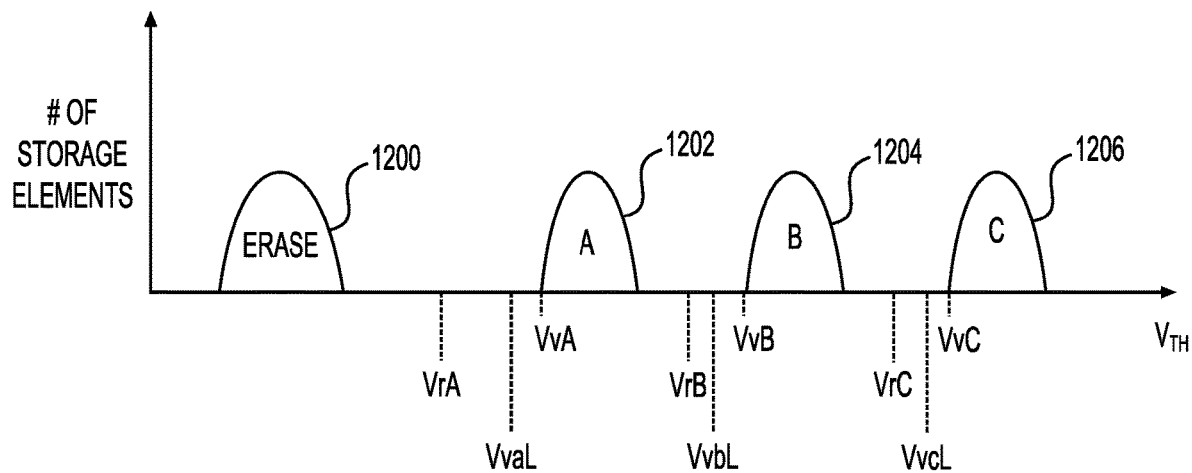
FIG. 12A depicts an example set of threshold voltage distributions for a four-state memory device in which each storage element stores two bits of data according to aspects of the disclosure.

In some embodiments, a "verify low" and a "verify high" reference voltage is used. FIG. 12A depicts an example set of threshold voltage distributions for a four-state memory device in which each storage element stores two bits of data. A first threshold voltage distribution 1200 is provided for erased (Erased-state) storage elements. Three threshold voltage distributions 1202, 1204 and 1206 represent programmed states A, B and C, respectively. In one embodiment, the threshold voltages in the Erased-state are negative, and the threshold voltages in the A-, B- and C-states are positive.

Read reference voltages, VrA, VrB and VrC, are also provided for reading data from storage elements. By testing whether the threshold voltage of a given storage element is above or below VrA, VrB and VrC, the system can determine the state, e.g., the storage element is in.

Further, verify reference voltages, VvA, VvB, and VvC are provided. When programming storage elements to the A-state, B-state or C-state, the system will test whether those storage elements have a threshold voltage greater than or equal to VvA, VvB or VvC, respectively. In one embodiment, "verify low" reference voltages, VvaL, VvbL, and VvcL are provided. Similar "verify low" reference voltages could also be used in embodiments with a different number of states.

Figure 12B:
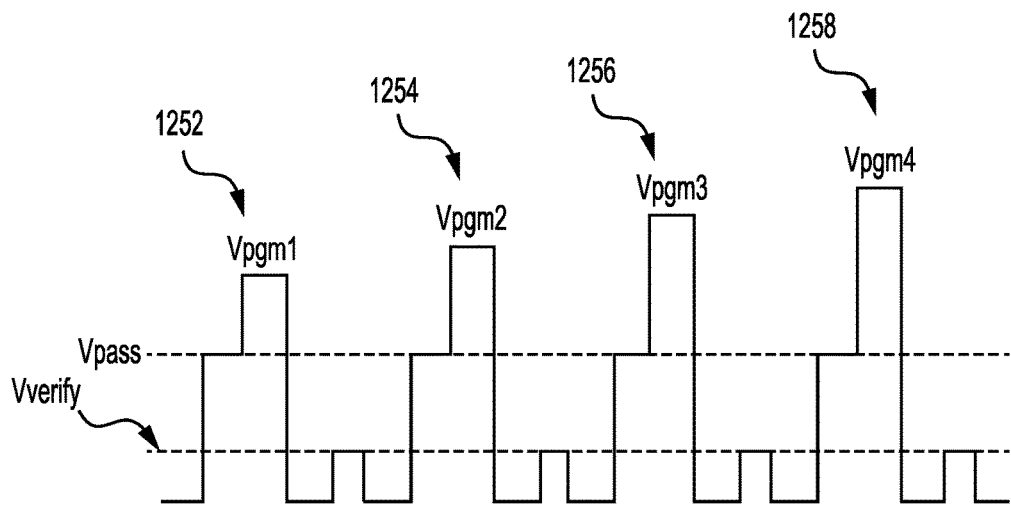
FIG. 12B shows a series of program pulses that may be used to program a distribution of FIG. 12A according to aspects of the disclosure.

In full sequence programming, storage elements can be programmed from the Erased-state directly to any of the programmed states A, B or C. For example, a population of storage elements to be programmed may first be erased so that all storage elements in the population are in the Erased-state. A series of program pulses such as depicted in FIG. 12B is used to program storage elements directly into the A-, B- and C-states. While some storage elements are being programmed from the Erased-state to the A-state, other storage elements are being programmed from the Erased-state to the B-state and/or from the Erased-state to the C-state. Note that using a full sequence programming is not required.

One example of a slow programming mode uses low (offset) and high (target) verify levels for one or more data states. For example, VvaL and VvA are offset and target verify levels, respectively, for the A-state, and VvbL and VvB are offset and target verify levels, respectively, for the B-state. During programming, when the threshold voltage of a storage element which is being programmed to the A-state as a target state (e.g., an A-state storage element) exceeds VvaL, its programming speed is slowed, such as by raising the bit line voltage to a level, e.g., 0.6-0.8 V, which is between a nominal program or non-inhibit level, e.g., 0 V and a full inhibit level, e.g., 2-3 V. The middle value may be referred to as a quick pass write (QPW) value. This provides greater accuracy by avoiding large step increases in threshold voltage. In some embodiments, values for one or more of the nominal program value, QPW value, and/or the inhibit value depend on the location of the word line that is selected for programming.

When the threshold voltage reaches VvA, the storage element is locked out from further programming. Similarly, when the threshold voltage of a B-state storage element exceeds VvbL, its programming speed is slowed, and when the threshold voltage reaches VvB, the storage element is locked out from further programming. In one approach, a slow programming mode is not used for the highest state since some overshoot is typically acceptable. Instead, the slow programming mode can be used for the programmed states, above the erased state, and below the highest state.

Moreover, in the example programming techniques discussed, the threshold voltage of a storage element is raised as it is programmed to a target data state. However, programming techniques can be used in which the threshold voltage of a storage element is lowered as it is programmed to a target data state. Programming techniques which measure storage element current can be used as well. The concepts herein can be adapted to different programming techniques.

FIG. 12B depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 1252, 1254, 756 and 1258 have program voltages of Vpgm1, Vpgm2, Vpgm3 and Vpgm4, respectively, and so forth. A set of one or more verify voltages may be provided after each program pulse. In some embodiments, there may be two or more verify pulses between the program pulses. For example, one pulse might be used to verify the A-state and the B-state, a second may be used to verify the C-state and a D-state, etc. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 13:
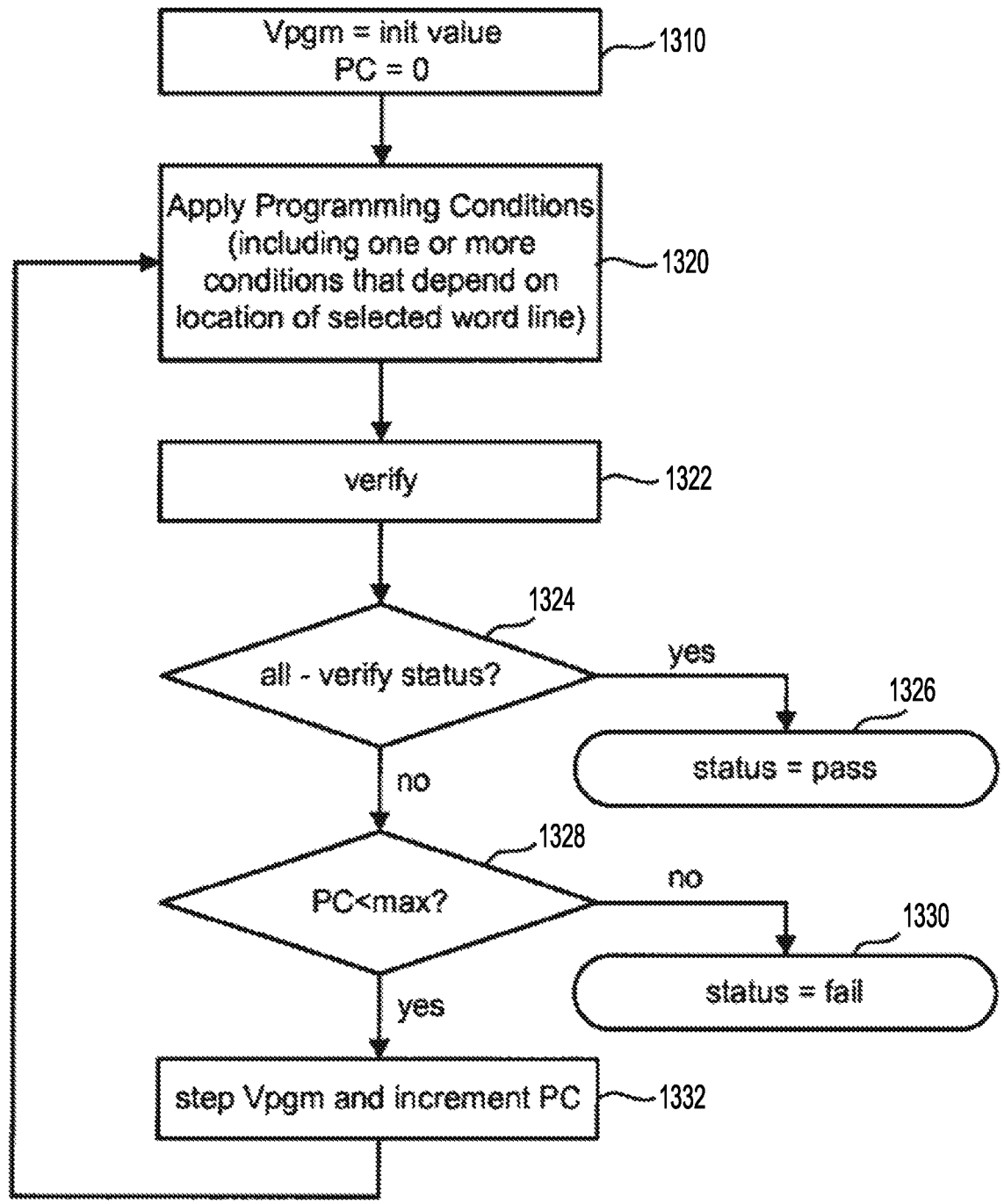
FIG. 13 is a flowchart describing one embodiment of a programming process according to aspects of the disclosure.

FIG. 13 is a flowchart describing one embodiment of a programming process, which includes one or more verification steps. In one embodiment, the process is used to program memory cells on a selected word line. In one embodiment, the process is used to program every memory cell on the selected word line. In one embodiment, the process is used to program every other memory cell (e.g., odd/even programming) on the selected word line.

In step 1310, the program voltage (Vpgm) is set to an initial value. In one embodiment, the magnitude of the program voltage depends on which word line is selected for programming. In one embodiment, the initial magnitude of Vpgm is lower when programming an edge word line. Also, in step 1310, a program counter (PC) is initialized to zero.

Figure 14:
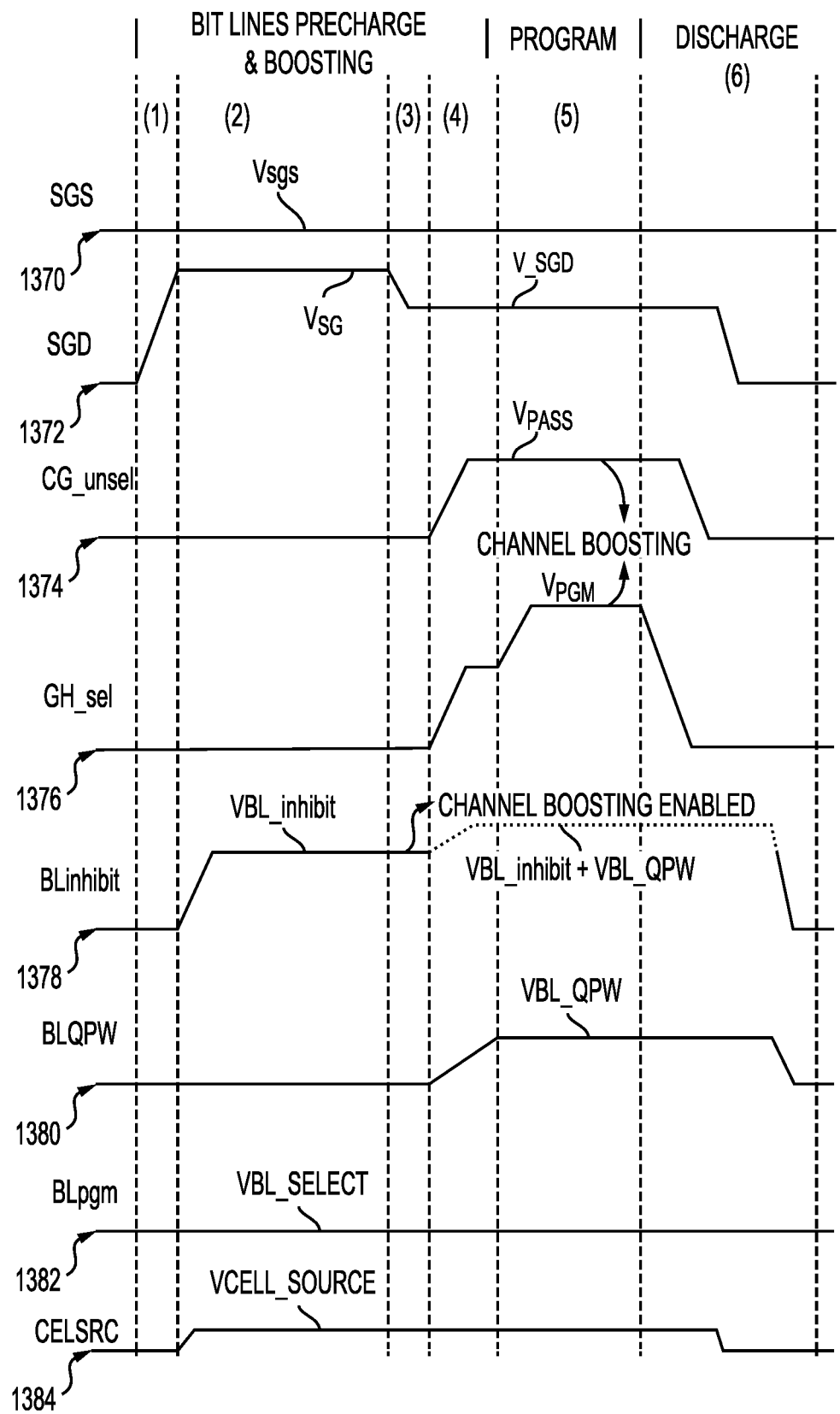
FIG. 14 is a timing diagram illustrating voltages during program operations according to aspects of the disclosure.

In step 1320, programming conditions are applied. One or more of the programming conditions may depend on the location of which word line is selected for programming. FIG. 14, to be discussed below, shows some examples of programming conditions that may be applied during step 1320.

Applying the programming conditions includes applying a programming signal (e.g., voltage pulse) to a selected word line. In one embodiment, the width of the voltage pulse depends on the location of the selected word line on the NAND string. In one embodiment, the voltage pulse has a shorter width when an edge word line is selected for programming than when one of the middle word lines is selected.

Step 1320 may also include applying an appropriate voltage to bit lines. In one embodiment, a first voltage (e.g., a low voltage) is applied to bit lines associated with NAND strings having a memory cell presently undergoing normal (or fast) programming, a second voltage (e.g., a medium voltage) is applied to bit lines associated with NAND strings having a memory cell presently undergoing slow programming, and a third voltage (e.g., a high voltage) is applied to bit lines associated with NAND strings having a memory cell presently inhibited from or locked out from further programming. In one embodiment, the magnitude of the first voltage depends on the location of the selected word line along the NAND string. In one embodiment, the magnitude of the second voltage depends on the location of the selected word line along the NAND string. In one embodiment, the magnitude of the third voltage depends on the location of the selected word line along the NAND string.

Step 1320 may also include applying an appropriate voltage to a common source line. In one embodiment, the magnitude of the voltage to a common source line depends on the location of the selected word line along the NAND string. Note that the common source line may be in electrical contact with diffusion regions of SGS transistors (e.g., source side select gate transistor 152 of FIG. 1). Thus, in one embodiment, the magnitude of the voltage applied to the (source) diffusion region of the SGS transistor depends on the location of the selected word line along the NAND string.

Step 1320 may also include applying an appropriate voltage to a gate of a select gate of a NAND string. Stated another way, step 1320 may include applying an appropriate voltage to select line of a NAND string. The select gate may be for either a SGS transistor or a SGD transistor (e.g., drain side select gate transistor 140 of FIG. 1). Thus, the select line may be either a source side select line (e.g., SGS) or a drain side select line (e.g., SGD). In one embodiment, the magnitude of the voltage to the gate of a select transistor of a NAND string depends on the location of the selected word line along the NAND string. In other words, the magnitude of the voltage to a select line (SGS and/or SGG) of a NAND string depends on the location of the selected word line along the NAND string.

Applying the program conditions in step 1320 may also include applying a pass voltage to unselected word lines. The magnitude of the pass voltage for each unselected word line may depend on which boosting scheme is being used. A variety of boosting schemes including, but not limited to, self-boosting (SB), local self-boosting (LSB), and erase area self-boosting (EASB) may be used. As is known to those of ordinary skill in the art, the magnitude of the pass voltage may be different for different unselected word lines. Also, the magnitude of the pass voltage for a given unselected word line may depend on the relative location of that unselected word line to the word line that is selected for programming. The pass voltage may help to reduce program disturb by boosting the voltage of the channel below the memory cell. Applying programming conditions that depend on the location of the selected word line may prevent or reduce leakage of the boosted channel potential. Therefore, program disturb may be prevented or reduced.

In step 1322, a verification process is performed. In one embodiment, the verification is a concurrent coarse/fine verify. Referring to FIG. 7A, as one example, some memory cells that are being programmed to the A-state are verified using the VvaL level, and others that are being programmed to the A-state are verified using the Vva level. During the initial programming steps in which the memory cell's threshold is well below the final level (Vva), course programming may be applied. However, after the memory cell's threshold voltage reaches VvaL, fine programming may be used. Thus, some memory cells are verified for coarse programming, whereas other memory cells are verified for fine programming. Note that when a particular memory cell has been verified as being programmed to its intended state, it may be locked out from further programming. Note that using coarse/fine programming is not required. In one embodiment, the intermediate verify levels (e.g., VvaL, VvbL, etc.) are not used.

In step 1324, it is determined whether all or almost all of the memory cells have verified that their threshold voltages are at the final target voltage for that memory cell. If so, the programming process is completed successfully (status=pass) in step 1326. If all or almost all of the memory cells are not verified to have reached their final target levels, then it is determined whether the program counter (PC) is less than a maximum value such as 20. If the program counter (PC) is not less than max (step 1328), then the program process has failed (step 1330). If the program counter (PC) is less than a maximum value (e.g., 20), then the program counter (PC) is incremented by one and the program voltage is stepped up to the next pulse in step 1332. Subsequent to step 1332, the process loops back to step 1320 and the next program pulse is applied to the memory cells.

FIG. 14 is a timing diagram illustrating voltages during program operations, according to one embodiment. The timing diagram depicts one embodiment of programming conditions that are applied during step 1320 of the process of FIG. 13. In various embodiments, one or more of the programming conditions depends on the location of the selected word line. In some embodiments, the magnitude of a voltage depends on the location of the selected word line. In one embodiment, the duration of the program voltage depends on the location of the selected word line.

The voltages shown are applied to various select lines, word lines, bit lines, and the common source line of the memory array, for NAND strings under fast programming, slow programming, and program inhibition. The program operation can be grouped into a Bit Lines Precharge Phase, a Program Phase and a Discharge Phase.

Bit Lines Precharge Phase: During phase (1), the SGS transistors (e.g., source side select gate transistor 152 of FIG. 1) are turned off by SGS being at Vsgs (voltage waveform 1370 in FIG. 14) while the SGD transistors (e.g., drain side select gate transistor 140 of FIG. 1) are turned on by SGD going high to Vsg (voltage waveform 1372 in FIG. 14), thereby allowing a bit line to access a NAND string. In one embodiment, the magnitude of Vsgs depends on the location of the selected word line. In one embodiment, the magnitude of Vsgs is higher when lower word lines are being programmed to prevent or reduce GIDL. In one embodiment, the magnitude of Vsgs is negative when middle word lines or higher word lines are being programmed to prevent or reduce program disturb associated with DIBL.

During phase (2), the bit line voltage of a program-inhibited NAND string is allowed to rise to a predetermined voltage given by VBL_inhibit (voltage waveform 1378 in FIG. 14). When the bit line voltage of the program-inhibited NAND string rises to VBL_inhibit, the program-inhibited NAND string will float when the gate voltage on the SGD transistor drops to V_SGD (shown in waveform 1378 as the dashed line). In one embodiment, the voltage VBL_inhibit depends on which word line is selected for programming.

At the same time, the bit line voltage of a programming NAND string is either pulled down to VBL_Select or maintained at VBL_Select if already there (voltage waveform 1382 in FIG. 14). In one embodiment, the voltage VBL_Select depends on which word line is selected for programming.

Also during phase (2), the bit line voltage of NAND strings that are undergoing slow programming is set to an intermediate voltage given by VBL_QPW (voltage waveform 1380 in FIG. 14). The voltage VBL_QPW is between VBL_Select and VBL_inhibit. The voltage VBL_QPW allows the selected memory cell to program, but at a slower rate than if VBL_Select were used. In one embodiment, the voltage VBL_QPW depends on which word line is selected for programming.

Also during phase (2), the voltage on the common source line is set to voltage given by V_Cell_Source (voltage waveform 1384 in FIG. 14). In one embodiment, the voltage V_Cell_Source depends on which word line is selected for programming.

During phase (3), the drain select line (SGD) connecting to the SGD transistors of NAND strings has its voltage lowered to V_SGD. In one embodiment, this will float only those program-inhibited NAND strings where their bit line voltage is comparable to V_SGD, since their SGD transistors are turned off (voltage waveforms 1372 and 1378 in FIG. 14). As for the NAND strings containing a memory cell to be programmed, their SGD transistors will not be turned off relative to the bit line voltage (e.g., near 0V) at their drain. In one embodiment, the voltage V_SGD depends on which word line is selected for programming. In one embodiment, the voltage V_SGD depends on the location of the selected word line in order to prevent or eliminate effects of DIBL. For example, the SGD transistors of unselected NAND strings may be kept off despite their Vth being lowered by DIBL. In one embodiment, the magnitude of V_SGD is lower for higher selected word lines, which may keep the SGD transistors turned off despite possible DIBL.

In one embodiment, the magnitude of V_SGD depends on the location of the selected word line in order to prevent or eliminate effects of GIDL. For example, the magnitude of V_SGD may be higher when the selected word line is near the SGD transistors (relative to when the selected word line is a middle word line, for example). This increase in V_SGD may prevent leakage of charge from the boosted channel due to GIDL.

During phase (4), the memory cells in a NAND string not being programmed have their control gate voltage set to VPASS (voltage waveform 1374 in FIG. 14). Also, the memory cell being programmed may have its control gate voltage set to VPASS (voltage waveform 1376 in FIG. 14). Since a program-inhibited NAND string is floating, the VPASS applied to the control gates of the memory cells boosts up the voltages of their channels. For the sake of discussion, the entire NAND string may be considered to have a channel. Thus, it may be stated that VPASS boosts the channel voltage of the NAND string. VPASS may be set to some intermediate voltage (e.g., ~10V) relative to Vpgm (e.g., ~15-24V). Depending on the boosting scheme being used, the value of VPASS is not required to be the same for each unselected word line.

Program Phase: During phase (5), a programming voltage Vpgm is applied to the control gate of a memory cell selected for programming (voltage waveform 1376 in FIG. 14). This may be achieved by applying Vpgm to the selected word line. The memory cells under program inhibition (e.g., with boosted channels) will not be programmed. The memory cells under programming will be programmed. Note that Vpgm may also contribute to channel boosting. Applying program conditions that depend on which word line is selected may prevent or substantially reduce the boosted channel voltage from reducing during the program phase.

In one embodiment, the duration of the program pulse (e.g., duration of phase 5) depends on the location of the selected word line. This may help to reduce or eliminate program disturb.

In the Discharge Phase: During phase (6), the various control lines and bit lines are allowed to discharge.

Any combination of the selected word line dependent signals discussed in connection with FIG. 14 may be used together when programming non-volatile storage.

Figure 15:
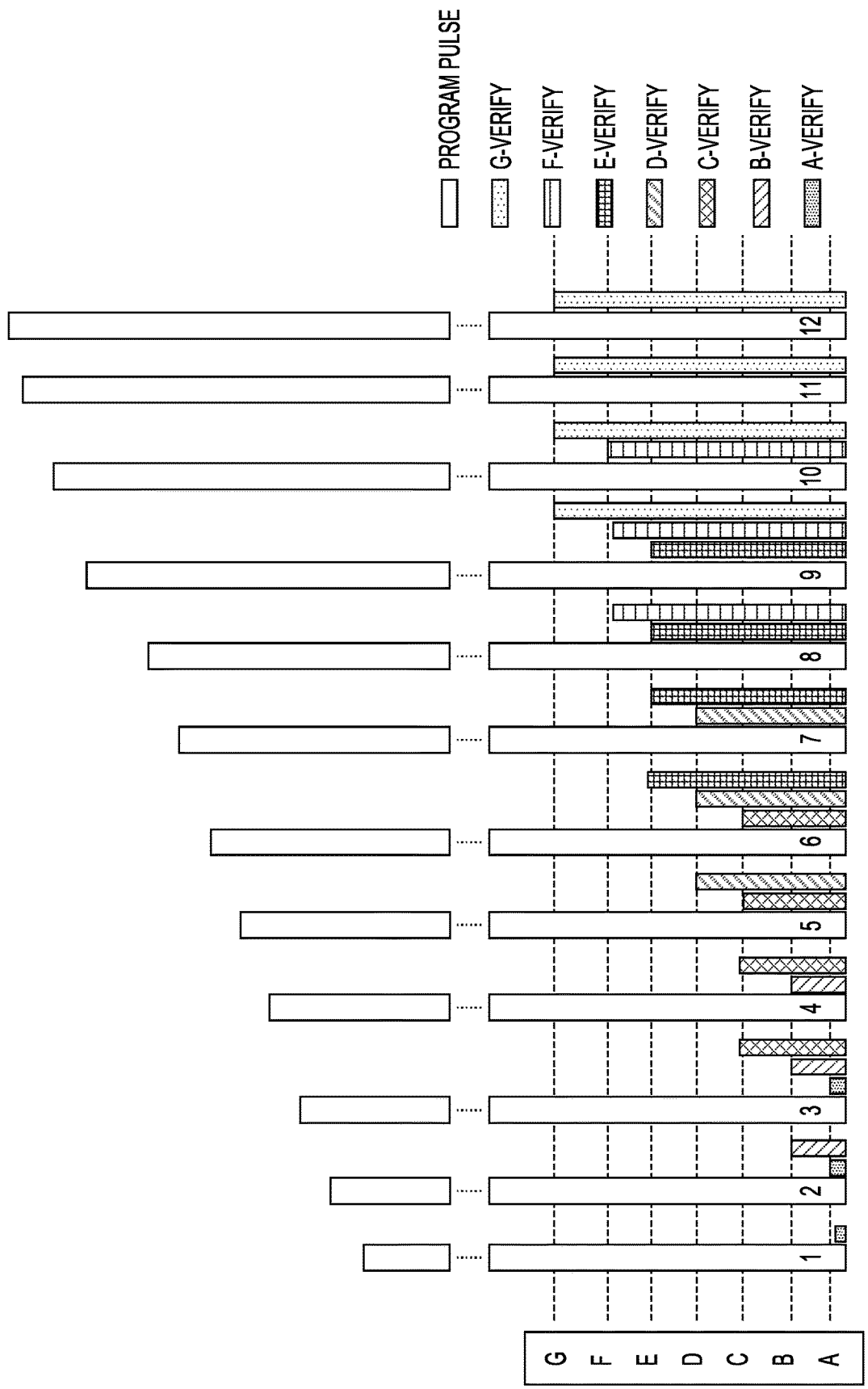
FIG. 15 shows an exemplary triple-level cell (TLC) program-verify pulse train according to aspects of the disclosure.

In 3D NAND, program speed is typically dominated by the nature of program mechanism, minimum program chunks (i.e., page size) and device architecture (amount of planes). In addition, some device modes are developed to improve program speed including, smart verify, smart skip program verify or smart program count verify (PCV) and STPFINE. As discussed above, smart PCV (SPCV) determines the algorithm for program-verify triggering for each state. FIG. 15 shows an exemplary triple-level cell (TLC) program-verify pulse train. As shown, from A-verify to G-verify, most states require 3-4 verify pulses. As a result, the total number of program-verify pulses is around two times of the total number of program pulse. In the exemplary program-verify pulse train, 12 program pulses are shown and 24 verify pulses. For instance, A-verify is applied following the $1^{st}$-$3^{rd}$ program pulse, while B-verify and C-verify are applied post $2^{nd}$-$4^{th}$ program pulse and $3^{rd}$-$6^{th}$ pulse. The total number of verify pulses is mainly dependent by the setting of smart PCV. Some implementations of smart PCV use the verify level of state N−1 ($S_{N-1}$) of an earlier one of the plurality of data states as a detection level to judge whether the natural VT of a selected one of the plurality of data states N ($NVT_N$) already reaches the verify level for the selected one of the plurality of data states $S_N$. When the SPCV failure bit count (FBC) of the earlier one of the plurality of data states $S_{N-x}$ is higher than a SPCV criteria (bitscan pass fail for SPCV or BSPF_SPCV), the verify pulses of the selected one of the plurality of data states $S_N$ will be triggered after skipping a pre-defined loop number. For example, one loop may be skipped as default. If the verify pulse of the selected one of the plurality of data states $S_N$ is triggered too early, it will cause high program time tProg. In contrast, if the verify pulse of the selected one of the plurality of data states $S_N$ is triggered too late, it may induce an over program issue. Therefore, it is important to shorten program time tProg by skipping verify pulses and avoiding the over program risk.

In addition, how many verify pulses required for each of the plurality of data states for TLC program are also determined by the natural threshold voltage VT width. For instance, if the natural threshold voltage VT is narrower than a default width, the verify pulse of selected one of the plurality of data states $S_N$ is expected to be triggered later or completed earlier than default condition. Therefore, it is important to develop novel algorithm to tighten the ongoing natural threshold voltage VT width during TLC program for program time tProg reduction.

Consequently, described herein is a memory apparatus (e.g., memory device 100 of FIG. 1, non-volatile storage device 710 of FIG. 7) includes memory cells (e.g., storage elements 142, 144, 146, 148, and 149 of FIG. 1) each connected to one of a plurality of word lines (e.g., WL0-WL63 of FIG. 1). The memory cells are disposed in one or more strings (e.g., NS0 to NS11 of FIG. 1) and configured to retain a threshold voltage Vt or Vth corresponding to one of a plurality of memory states (e.g., Erase, A, B, C, D, E, F and G in FIG. 11A, ERASE, A, B, and C in FIG. 12A). The memory apparatus also includes a control means (e.g., one or any combination of control circuitry 720, power control circuit 726, decoder circuit 724, state machine circuit 722, decoder circuit 742A, decoder circuit 742B, decoder circuit 740A, decoder circuit 740B, read/write circuits 730A, read/write circuits 730B, and/or controller 744 of FIG. 7) coupled to the plurality of word lines and the strings. The control circuit is configured to apply verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation. The control means is also configured to slow the memory cells targeted for a selected one of the plurality of data states $S_N$ identified as being faster to program than other ones of the memory cells targeted for the selected one of the plurality of data states $S_N$ during one of the plurality of verify loops associated with an earlier one of the plurality of data states $S_{N-x}$. The selected one of the plurality of data states $S_N$ corresponds to the threshold voltage of the memory cells being higher than for the earlier one of the plurality of data states $S_{N-x}$.

Figure 16:
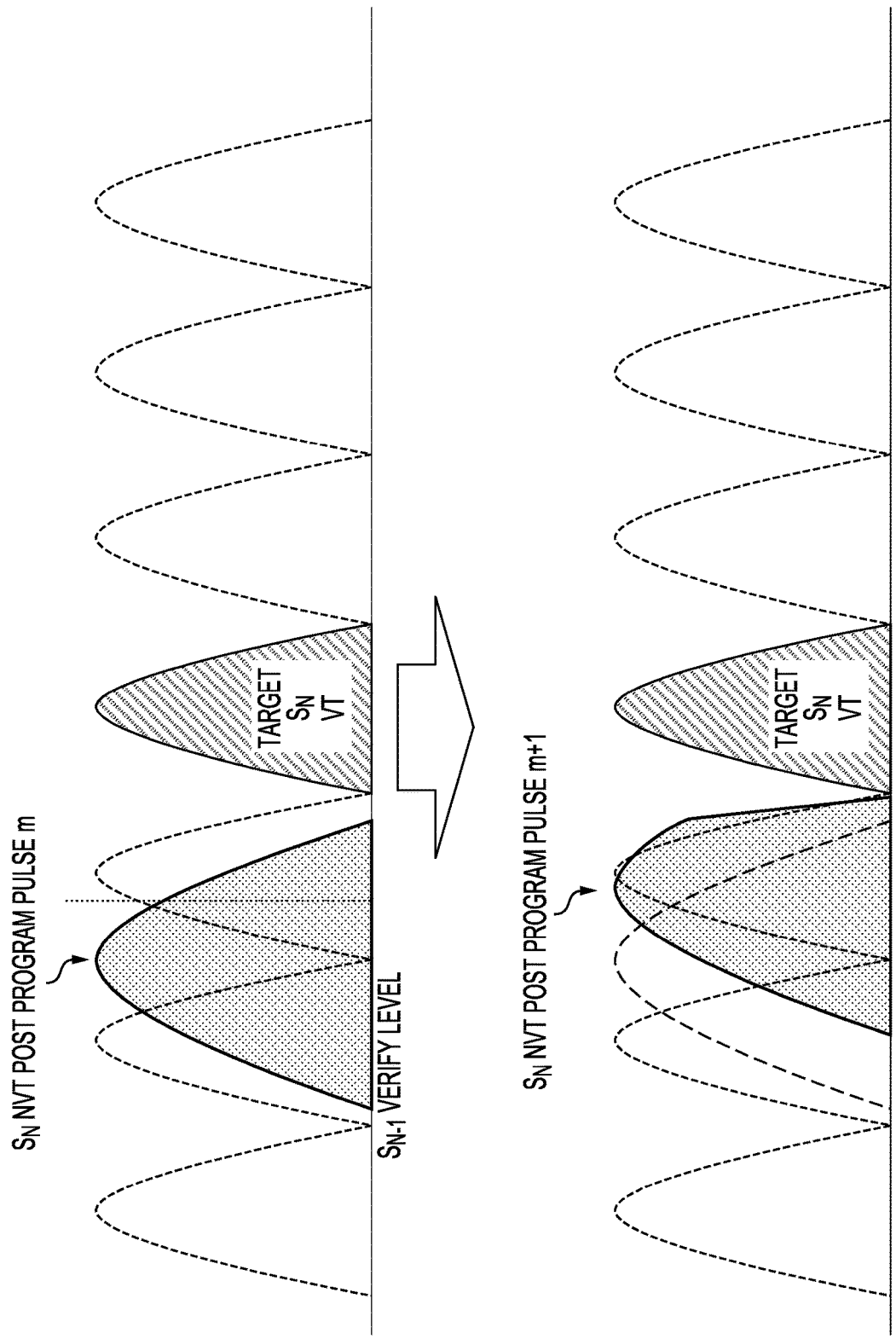
FIG. 16 shows the basic concept of the disclosed state look ahead quick pass write (SLAQPW) algorithm according to aspects of the disclosure.

FIG. 16 shows the basic concept of the disclosed state look ahead quick pass write SLAQPW algorithm. After a program pulse m, the natural threshold voltage NVT for the selected one of the plurality of data states $S_N$ is a default distribution. Post program pulse m+1, the natural threshold voltage NVT for the selected one of the plurality of data states $S_N$ is tightened by slowing down fast bits. As will be detailed below, the identity of fast bits for the selected one of the plurality of data states $S_N$ is based on the verify level of the earlier one of the plurality of data states $S_{N-x}$, this is known as "state look ahead (SLA) early sensing". As fast bits for the selected one of the plurality of data states $S_N$ are detected, a bit line voltage Vbl offset will be applied to the associated bit lines during program pulse m+1. As a result, the slowing down of fast bits for the selected one of the plurality of data states $S_N$ is achieved. So, the SLAQPW algorithm disclosed herein is proposed to tighten the ongoing natural threshold voltage VT width by slowing down the fast bits of upcoming states (i.e., the selected one of the plurality of data states $S_N$) in advance.

As discussed above, the memory apparatus can further include a first data latch TDL configured to store a first status bit and a second data latch SDL configured to store a second status bit. Again, examples of data latches can be found in U.S. Pat. No. 10,535,401, which is incorporated by reference herein. The strings are each coupled to one of a plurality of bit lines. Thus, according to an aspect, the control means is further configured to categorize the memory cells using the first status bit and the second status bit. The control means updates the first status bit and the second status bit based on sensing the memory cells targeted for the selected one of the plurality of data states $S_N$ identified as being faster to program than other ones of the memory cells targeted for the selected one of the plurality of data states $S_N$ during the one of the plurality of verify loops associated with the earlier one of the plurality of data states $S_{N-x}$.

According to an aspect, each of the memory cells is configured to store three bits. So, the plurality of data states includes, in order of the threshold voltage increasing in magnitude, an erased data state and a first data state and a second data state and a third data state and a fourth data state and a fifth data state and a sixth data state and a seventh data state (e.g., Erase, A, B, C, D, E, F and G in FIG. 11A). As a result, the plurality of program verify voltages includes a verify low reference voltage (e.g., VvaL, VvbL, and VvcL in FIG. 12A) and a verify high reference voltage (e.g., VvA, VvB, and VvC in FIG. 12A) for each of the plurality of data states. The verify low reference voltage is lower in magnitude than the verify high reference voltage. While TLC programming is used as an example for describing the memory apparatus and method described herein, it should be understood that the memory cells may instead be quad-level cells (QLC) or otherwise.

The first status bit and the second status bit define a plurality of latch states each corresponding to one of a plurality of bit line voltages. The plurality of latch states include, in order if increasing magnitude, a first latch state associated with the one of the plurality of bit line voltages being approximately zero volts, a second latch state associated with the one of the plurality of bit line voltages being a quick pass write bit line voltage Vqpw, a third latch state associated with the one of the plurality of bit line voltages being the quick pass write bit line voltage Vqpw plus a state look ahead quick pass write bit line voltage Vslaqpw, and a fourth latch state associated with the one of the plurality of bit line voltages being a fully inhibited bit line voltage VDDSA and the control means is configured to apply the one of the plurality of bit line voltages to each of the plurality of bit lines coupled to the memory cells being programmed in the program-verify operation depending on which of the plurality of latch states corresponds to the first status bit and the second status bit to adjust a programming speed of the memory cells being programmed while applying one of a plurality of program pulses of the program-verify operation. So, the fast cells can be slowed down by applying the one of the plurality of bit line voltages Vbl in next program pulse to inhibit or slow programming. As a result, it is expected that verify pulses may be skipped. As a result, the SLAQPW algorithm described herein is expected to efficiently reduce the total number of verify pulses and shorten program time tProg.

The termination of SLA early sensing of the selected one of the plurality of data states $S_N$ can be based on a SPCV bit scan for the earlier one of the plurality of data states $S_{N-x}$ without an additional bit scan. So, according to another aspect, the control means is further configured to identify the memory cells targeted for the selected one of the plurality of data states $S_N$ as having the threshold voltage above the verify low reference voltage for the earlier one of the plurality of data states $S_{N-x}$ (i.e., $VL_{n-x}$) in a state look ahead quick pass write process. The control means counts a selected state look ahead quick pass write quantity of the memory cells targeted for the selected one of the plurality of data states $S_N$ identified as having the threshold voltage above the verify low reference voltage for the earlier one of the plurality of data states in the state look ahead quick pass write process. The control means is configured to determine whether the selected state look ahead quick pass write quantity is greater than a predetermined minimum selected state look ahead quick pass write off quantity in the state look ahead quick pass write process. The control means then terminates the state look ahead quick pass write process in response to determining the selected state look ahead quick pass write quantity is greater than the predetermined minimum selected state look ahead quick pass write off quantity.

As mentioned above, quick pass write (QPW) for each of the plurality of data states is executed with VL/VH sensing, slowing down the fast bit for target data states and thus obtaining a tight threshold voltage VT distribution. For $S_xLAQPW$, the fast bit of upcoming state or selected one of the plurality of data states ($S_N$) can be slowed down by SLA early sensing with the VL level of early state or earlier one of the plurality of data states ($S_{N-x}$).

Figure 17A:
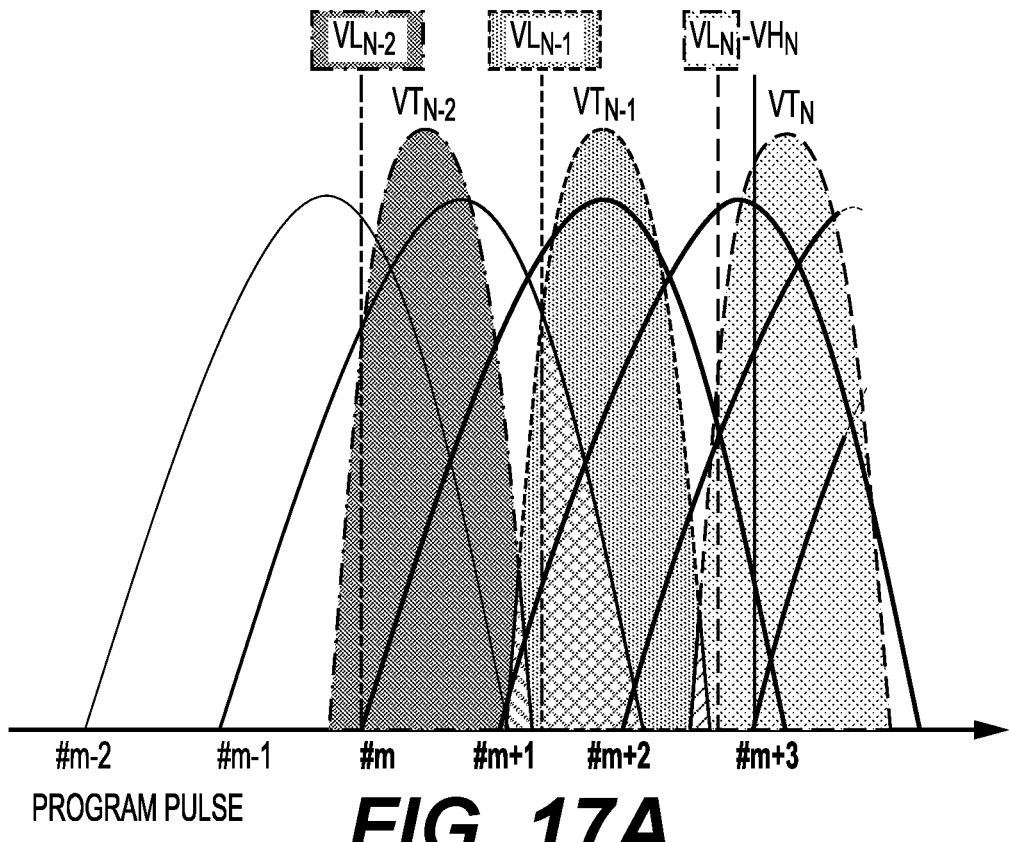
FIGS. 17A-17C are exemplary diagrams about TLC threshold voltage VT distribution formation according to aspects of the disclosure.
Figure 17B:
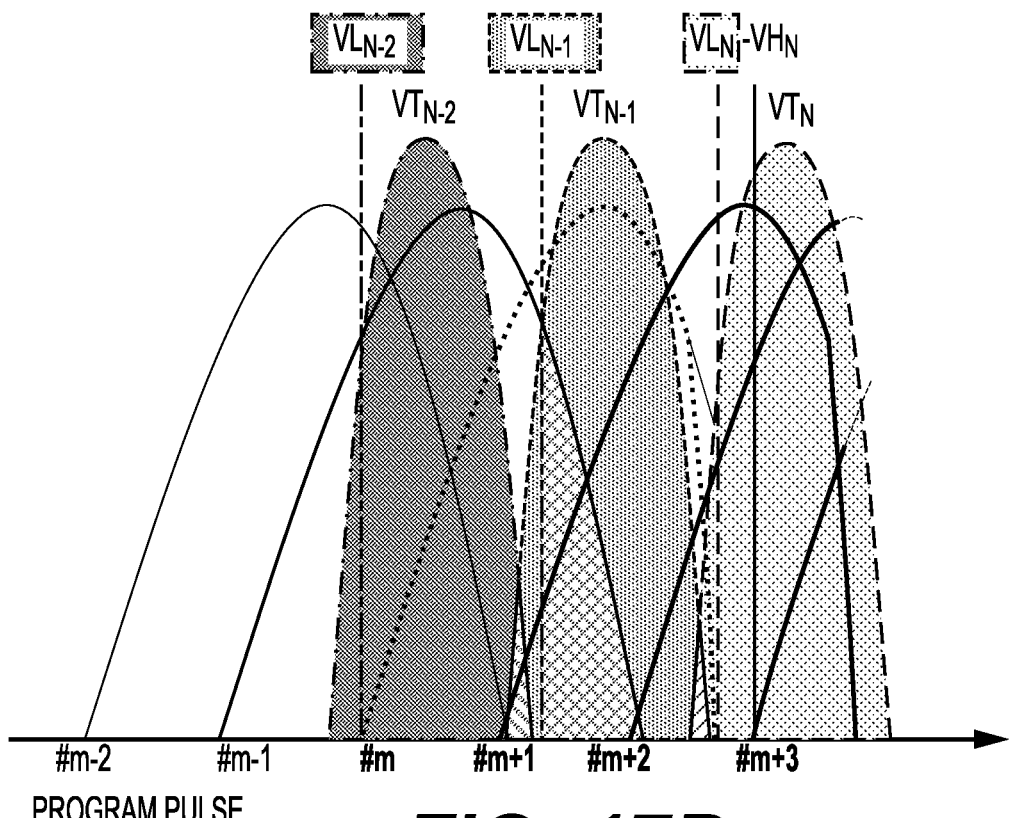
Figures 17C, 18:
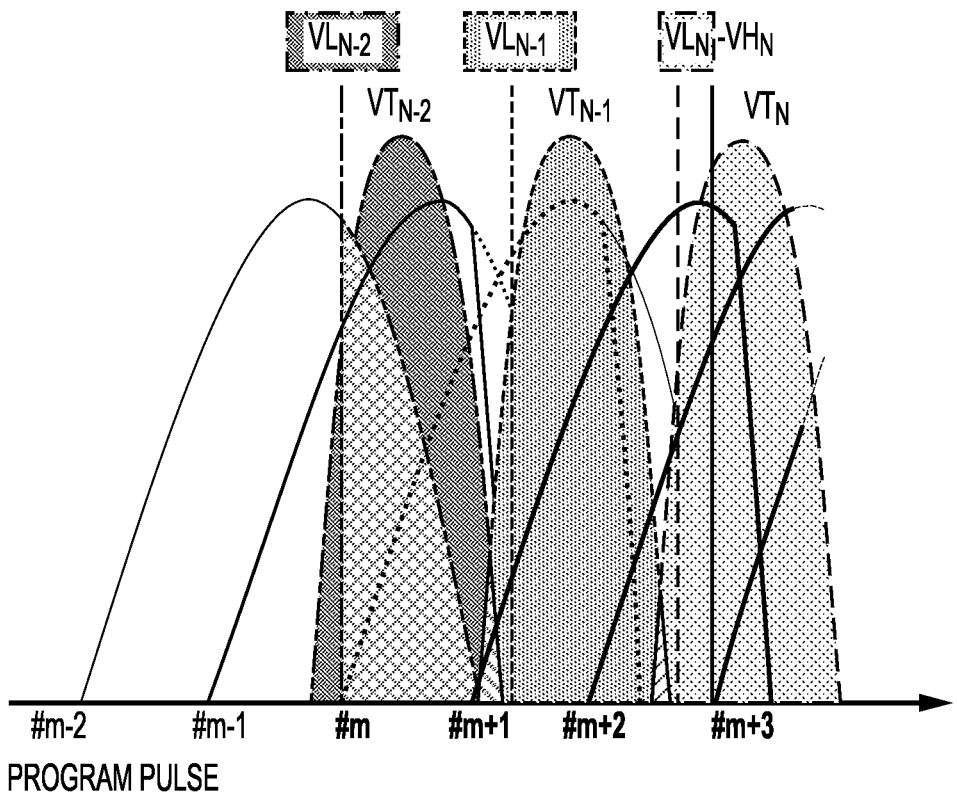
FIG. 18 is a table showing how the combination of a second data latch and a first data latch may be used during program operation according to aspects of the disclosure.

To help describe the $S_xLAQPW$ algorithm described herein, FIGS. 17A-17C are exemplary diagrams about TLC threshold voltage VT distribution formation. Here TLC states are defined as the selected one of the plurality of data states $S_N$ (N=0, 1, ..., 7). Here the natural threshold voltage NVT is only for the selected one of the plurality of data states $S_N$, which is named as $NVT_N$ (shown without color filling). As TLC program applied program pulses, $NVT_N$ is shifting pulse by pulse from $NVT_N\_\#m-2$ to $NVT_N\_\#m+3$, corresponding to each program pulse from #m-2 to _#m+3. Assumed state threshold voltage VT distribution is shown with shaded filling, which is determined by smart PCV and QPW. Here $VT_{N-2}$, $VT_{N-1}$, $VT_N$ indicates the state Vt distribution for $S_{N-2}$, $S_{N-1}$, and the selected one of the plurality of data states $S_N$, respectively. In FIGS. 17A-17C, the verify low reference voltage VL level for $S_{N-2}/S_{N-1}/S_N$, are shown as $VL_{N-2}/VL_{N-1}/VL_N$ and verify high reference voltage VH level of the selected one of the plurality of data states $S_N$ is shown as $VH_N$. During the TLC program-verify operation, each of the plurality of data states requires around 3-4 verify pulses (as shown in FIG. 15). Thus, in the exemplary diagram of default TLC program-verify operation, the assumed the selected one of the plurality of data states $S_N$ requires 4 verify pulses from $V_N\_\#m$ to $V_N\_\#m+3$ (FIG. 17A).

In some implementations of TLC programming with QPW, the trigger of the verify pulse of the selected one of the plurality of data states $S_N$ is determined by smart PVC. As shown in FIG. 17A, after program pulse #m-1 (P_#m-1), $NVT_{N-}\#m-1$ shows that a certain amount of fast bits pass $VL_{N-1}$ level (highlighted by "x" crosshatching), triggering the verify pulse $V_{N-}\#m$. When $V_{N-}\#m$ is triggered, QPW is applied on bits of the selected one of the plurality of data states $S_N$ to obtain a tight threshold voltage VT. Thus, the bits of the selected one of the plurality of data states $S_N$ between $VL_N$ and $VH_N$ will be slowed down, shown as the dashed line in the $NVT_{N-}\#m+1$, $NVT_{N-}\#m+2$, and $NVT_{N-}\#m+3$. If without QPW, these slow down bits will be distributed as dash line in the natural VT such as NVT_#m, NVT_#m+1, NVT_#m+2.

In the $S_xLAQPW$ algorithm, the fast bit of the selected one of the plurality of data states $S_N$ will be slowed down in advance (before the trigger of verify pulse of the selected one of the plurality of data states $S_N$). The exemplary $S_1LAQPW$ and $S_2LAQPW$ are shown in FIGS. 17B and 17C, respectively.

$S_1LAQPW$ QPW indicates slowing down the fast bits of the selected one of the plurality of data states $S_N$ by early sensing with $VL_{N-1}$ level. When the verify of $S_{N-1}$ is triggered, $S_{N-1}$ bits will be sensed by $VL_{N-1}/VH_{N-1}$ level and the selected one of the plurality of data states $S_N$ will be sensed by $VL_{N-1}$ level at the same time. The SLA early sensing of the selected one of the plurality of data states $S_N$ will be terminated if a passed bit number of the selected one of the plurality of data states $S_N$ is estimated higher than a pre-defined criteria. As shown in FIG. 17B, the fast bits of the selected one of the plurality of data states $S_N$ passing $VL_{N-1}$ will be slowed down in next program pulse by applying the quick pass write bit line voltage Vqpw on the associated bit lines. As shown, the fast bits of $NVT_{N-}\#m$ is highly slowed down, obtaining a tighter $NVT_{N-}\#m$ which will reach verify level $VL_N$. It indicates that there is no over program risk to skip $V_{N-}\#m$. Here $NVT_{N-}\#m$ is shown with dashed line to indicate the verify pulse $V_{N-}\#m$ is not necessary.

$S_2LAQPW$ indicates slowing down the fast bits of the selected one of the plurality of data states $S_N$ by early sensing with $VL_{N-2}$ level. When the verify of $S_{N-2}$ is triggered, $S_{N-2}$ bits will be sensed by $VL_{N-2}/VH_{N-2}$ level and the selected one of the plurality of data states $S_N$ upcoming will be sensed by $VL_{N-2}$ level at the same time. Similar with $S_1LAQPW$, the SLA early sensing of the selected one of the plurality of data states $S_N$ will be terminated if the passed bit number of the selected one of the plurality of data states $S_N$ is estimated higher than a pre-defined criteria. As shown in FIG. 17C, the fast bits of the selected one of the plurality of data states $S_N$ passing $VL_{N-2}$ will be slowed down in next program pulse by applying the quick pass write bit line voltage Vqpw on its BL. As shown, the obtained tighter $NVT_{N-}\#m-1$ does not reach $VL_{N-1}$ level. Thus, it will not trigger the verify pulse $V_{N-}\#m$. Here $NVT_{N-}\#m$ is shown with dash line to indicate the $V_N\#m$ is not necessary.

FIG. 18 is a table showing how the combination of the second data latch SDL and the first data latch TDL may be used during program operation. As shown, "TDL=0 & SDL=0", "TDL=1 & SDL=0" and "TDL=1 & SDL=1" are applied to define program, QPW, and inhibit cells, respectively. In addition, "TDL=0 & SDL=1" can be defined as "$S_xLAQPW+QPW$" cells without additional latches.

Thus, as discussed above and as shown in the flowchart discussed below, in SLAQPW, the proposed SLA early sensing for $S_N$ is performed with $VL_{N-x}$ sensing. Firstly, $VL_{N-x}$ detected cells of the selected one of the plurality of data states $S_N$ cells will be stored as "TDL=1 & SDL=0". Then the quick pass write bit line voltage Vqpw will be applied on its bit line to slow to its program in advance. As the selected one of the plurality of data states $S_N$ verify is triggered, default QPW with $VL_N$ sensing of the selected one of the plurality of data states $S_N$ will be performed. If $VL_{N-x}$ detected cells of the selected one of the plurality of data states $S_N$ are further detected by $VL_N$, they will be stored as "TDL=0 & SDL=1". Then an additional state look ahead quick pass write voltage Vslaqpw will be added on its bit line. Finally, its bit line voltage Vbl will be equal to the state look ahead quick pass write bit line voltage Vslaqpw+the quick pass write bit line voltage Vqpw.

So, in more detail, according to other aspects, the control means is further configured to start the program-verify operation for a selected one of the plurality of data states $S_N$. The control means is also configured to initialize the first status bit of the first data latch TDL as zero and the second status bit of the second data latch SDL as zero for the memory cells targeted for the selected one of the plurality of data states $S_N$. In addition, the control means is configured to apply one of the plurality of program pulses of the program-verify operation while applying one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed.

The control means determines whether the one of the plurality of verify loops associated with the earlier one of the plurality of data states $S_{N-x}$ has been triggered. The control means is additionally configured to determine whether another of the plurality of verify loops associated with the selected one of the plurality of data states $S_N$ using the verify low reference voltage and the verify high reference voltage for the selected one of the plurality of data states $S_N$ has been triggered in response to determining the one of the plurality of verify loops associated with the earlier one of the plurality of data states $S_{N-x}$ has not been triggered. The control means is also configured to determine whether a selected state look ahead quick pass write flag Sn_SLAQPW_flag equals one in response to determining the one of the plurality of verify loops associated with the earlier one of the plurality of data states $S_{N-x}$ has been triggered. Next, the control means is configured to perform the one of the plurality of verify loops associated with the earlier one of the plurality of data states $S_{N-x}$ using the verify low reference voltage for the earlier one of the plurality of data states $S_{N-x}$ and sense the memory cells targeted for the selected one of the plurality of data states $S_N$ in response to determining the selected state look ahead quick pass write flag Sn_SLAQPW_flag does not equal one. The control means then determines whether the another of the plurality of verify loops associated with the selected one of the plurality of data states $S_N$ using the verify low reference voltage and the verify high reference voltage for the selected one of the plurality of data states $S_N$ has been triggered in response to determining the selected state look ahead quick pass write flag Sn_SLAQPW_flag equals one. In addition, the control means is configured to identify the memory cells targeted for the selected one of the plurality of data states $S_N$ as having the threshold voltage above the verify low reference voltage for the earlier one of the plurality of data states $S_{N-x}$ and set the first status bit of the first data latch TDL as one and the second status bit of the second data latch SDL as zero for the memory cells targeted for the selected one of the plurality of data states $S_N$ identified as having the threshold voltage above the verify low reference voltage for the earlier one of the plurality of data states $S_{N-x}$. The control means is also configured to count a selected state look ahead quick pass write quantity of the memory cells targeted for the selected one of the plurality of data states $S_N$ identified as having the threshold voltage above the verify low reference voltage for the earlier one of the plurality of data states $S_{N-x}$. The control means then determines whether the selected state look ahead quick pass write quantity is greater than a predetermined minimum selected state look ahead quick pass write off quantity. The control means is additionally configured to determine whether the another of the plurality of verify loops associated with the selected one of the plurality of data states $S_N$ using the verify low reference voltage and the verify high reference voltage for the selected one of the plurality of data states $S_N$ has been triggered in response to determining the selected state look ahead quick pass write quantity is not greater than the predetermined minimum selected state look ahead quick pass write off quantity. Next, the control means is configured to set the selected state look ahead quick pass write flag Sn_SLAQPW_flag to be one in response to determining the selected state look ahead quick pass write quantity is greater than the predetermined minimum selected state look ahead quick pass write off quantity.

The control means is then configured to determine whether the another of the plurality of verify loops associated with the selected one of the plurality of data states $S_N$ using the verify low reference voltage and the verify high reference voltage for the selected one of the plurality of data states $S_N$ has been triggered. The control means returns to apply one of the plurality of program pulses of the program-verify operation while applying one of the plurality of bit line voltages to each of the plurality of bit lines coupled to the memory cells being programmed in the program-verify operation according to the first status bit and the second status bit to adjust the programming speed of the memory cells being programmed in response to determining the another of the plurality of verify loops associated with the selected one of the plurality of data states $S_N$ has not been triggered. The control means is also configured to perform another of the plurality of verify loops associated with the selected one of the plurality of data states $S_N$ using the verify low reference voltage and the verify high reference voltage for the selected one of the plurality of data states $S_N$ and sense the memory cells targeted for the selected one of the plurality of data states $S_N$ in response to determining the another of the plurality of verify loops associated with the selected one of the plurality of data states $S_N$ has been triggered. The control means is then configured to identify the memory cells targeted for the selected one of the plurality of data states $S_N$ as having the threshold voltage above the verify high reference voltage for the selected one of the plurality of data states $S_N$ and set the first status bit of the first data latch TDL as one and the second status bit of the second data latch SDL as one for the memory cells targeted for the selected one of the plurality of data states $S_N$ having the threshold voltage above the verify high reference voltage for the selected one of the plurality of data states $S_N$. In addition, the control means is configured to identify the memory cells targeted for the selected one of the plurality of data states $S_N$ as having the threshold voltage above the verify low reference voltage for the selected one of the plurality of data states $S_N$ and set the first status bit of the first data latch TDL as one and the second status bit of the second data latch SDL as zero in response to the first status bit being one and the second status bit being zero and set the first status bit of the first data latch TDL as zero and the second status bit of the second data latch SDL as one in response to the first status bit being one and the second status bit being zero for the memory cells targeted for the selected one of the plurality of data states $S_N$ having the threshold voltage above the verify low reference voltage for the selected one of the plurality of data states $S_N$ while not exceeding the verify high reference voltage for the selected one of the plurality of data states $S_N$.

The control means counts a selected state verify high quantity of the memory cells targeted for the selected one of the plurality of data states $S_N$ identified as having the threshold voltage above the verify high reference voltage for the selected one of the plurality of data states $S_N$. The control means is additionally configured to determine whether the selected state verify high quantity is less than a predetermined minimum selected state verify high on quantity. In addition, the control means is configured to return to apply the one of the plurality of program pulses of the program-verify operation while applying the one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed in response to the selected state verify high quantity not being less than the predetermined minimum selected state verify high on quantity. The control means is also configured to end the program operation in response to the selected state verify high quantity being less than the predetermined minimum selected state verify high on quantity.

The trigger for the one of the plurality of verify loops associated with the earlier one of the plurality of data states can be determined by SPCV. Correspondingly, the trigger for the another of the plurality of verify loops associated with the selected one of the plurality of data states $S_N$ using the verify low reference voltage and the verify high reference voltage for the selected one of the plurality of data states $S_N$ can be determined by a bitscan using the verify high reference voltage for the selected one of the plurality of data states $S_N$. So, the control means is further configured to determine whether the one of the plurality of verify loops associated with the earlier one of the plurality of data states $S_{N-x}$ has been triggered based on an even earlier bitscan count of the memory cells associated with an even earlier one of the plurality of data states $S_{N-x-1}$ having the threshold voltage exceeding an even earlier verify level for the even earlier one of the plurality of data states $S_{N-x-1}$ exceeding a predetermined even earlier bitscan threshold. The even earlier one of the plurality of data states $S_{N-x-1}$ corresponding to the threshold voltage of the memory cells being lower than for the earlier one of the plurality of data states $S_{N-x}$. The control means is also configured to determine whether the another of the plurality of verify loops associated with the selected one of the plurality of data states $S_N$ using the verify low reference voltage and the verify high reference voltage for the selected one of the plurality of data states $S_N$ has been triggered based on an earlier bitscan count of the memory cells associated with the earlier one of the plurality of data states $S_{N-x}$ having the threshold voltage exceeding the verify high reference voltage for the earlier one of the plurality of data states $S_{N-x}$ exceeding a predetermined earlier bitscan threshold.

FIG. 19 is a table showing one parameter F_SLAQP-W_EN that can be used to determine whether to enable the SLAQPW process or algorithm. As shown, for instance, F_SLAQPW_EN=0 indicate disabled SLAQPW and F_SLAQPW_EN=x (x>0) indicates enabling $S_x$LAQPW, in which the fast bits of upcoming states $S_{N+n+x}$ will be sensed by $VL_{N+n}$ level in advance.

FIG. 20 shows an exemplary program-verify waveform table for TLC programming with the $S_1$LAQPW algorithm. The program pulse (P_#n) and verify pulse (V_#m) in FIG. 20 is based on the TLC program shown in FIG. 15. In FIG. 20, SLAQPW $S_N$ indicates the performing of SLA early sensing on upcoming states or the selected one of the plurality of data states $S_N$. As mentioned above, the $S_1$LAQPW algorithm advantageously tightens the natural threshold voltage NVT of the selected one of the plurality of data states $S_N$ in advance, thus the first verify pulses (V_#1) for $S_2$-$S_7$ (shaded) are potentially skipped in some cases. The V_#1 in the shaded boxes indicate the verify pulse which is assumed to be skipped under SLAQPW algorithm (this assumption is only to show the role of SLAQPW on program time tProg reduction. Finally, the reduction of program time tProg is determined by how many verify pulses are skipped. The bolded SLAQPA_SN indicates these SLA early sensing loops may be terminated in some cases, which is determined by the selected state look ahead quick pass write flag Sn_SLAQPW_flag, as discussed above.

Figure 21:
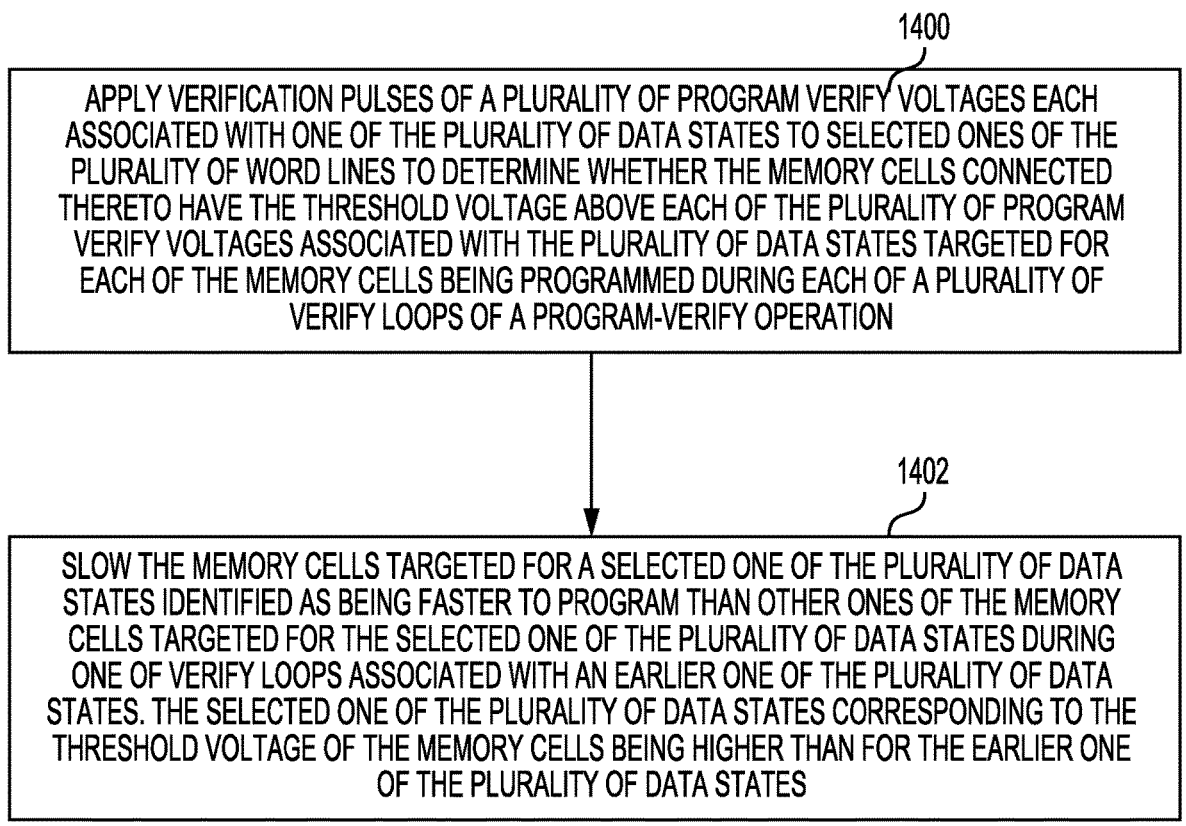
FIGS. 21 and 22 illustrate steps of a method of operating a memory apparatus according to aspects of the disclosure.
Figure 22:
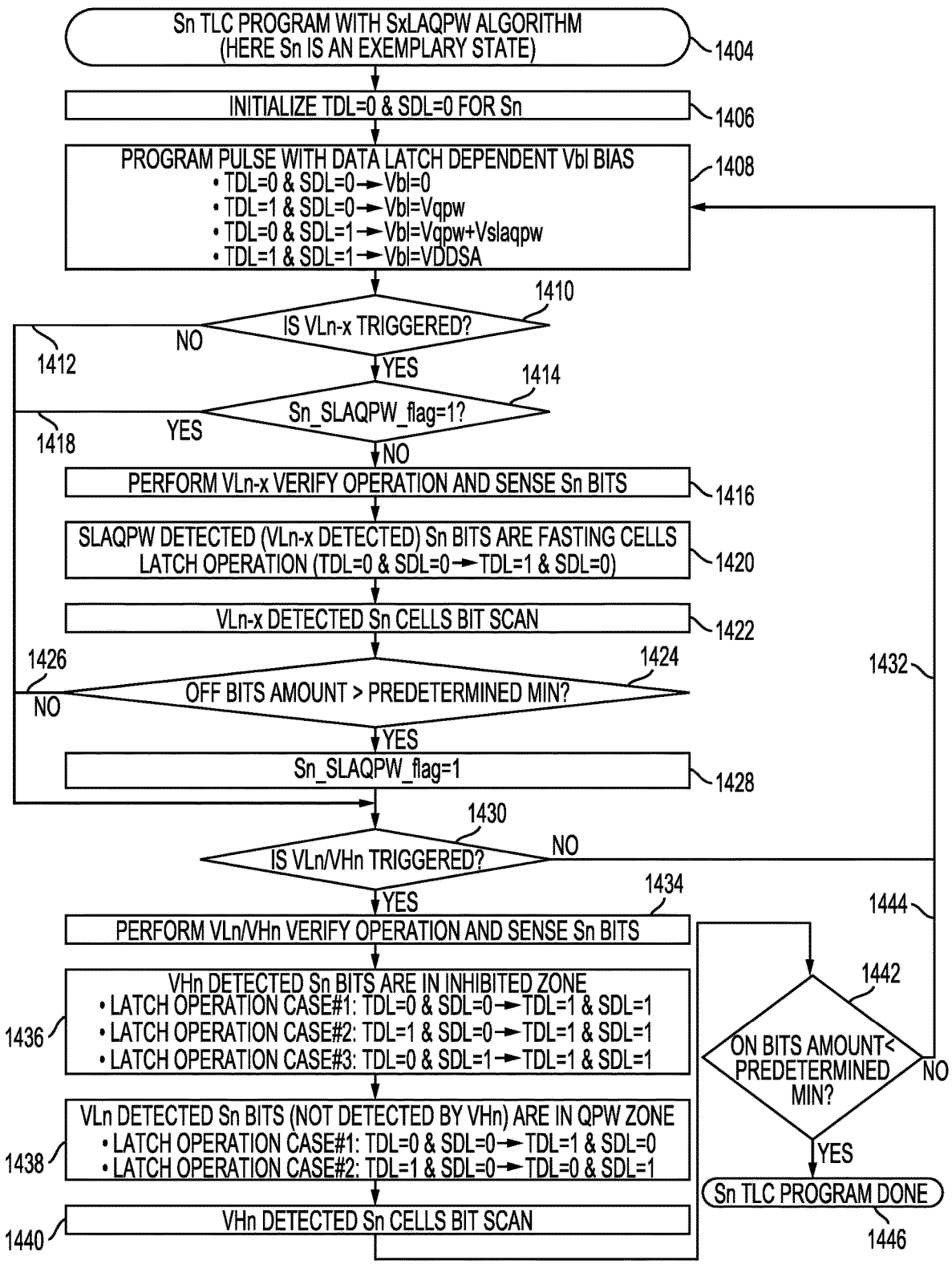

Referring now to FIGS. 21 and 22, a method of operating a memory apparatus is also provided. As discussed above, the memory apparatus (e.g., memory device 100 of FIG. 1, non-volatile storage device 710 of FIG. 7) includes memory cells (e.g., storage elements 142, 144, 146, 148, and 149 of FIG. 1) each connected to one of a plurality of word lines (e.g., WL0-WL63 of FIG. 1). The memory cells are disposed in one or more strings (e.g., NS0 to NS11 of FIG. 1) and configured to retain a threshold voltage Vt or Vth corresponding to one of a plurality of memory states (e.g., Erase, A, B, C, D, E, F and G in FIG. 11A, ERASE, A, B, and C in FIG. 12A). Referring initially to FIG. 21 specifically, the method includes the step of 1400 applying verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation. The method also includes the step of 1402 slowing the memory cells targeted for a selected one of the plurality of data states $S_N$ identified as being faster to program than other ones of the memory cells targeted for the selected one of the plurality of data states $S_N$ during one of the plurality of verify loops associated with an earlier one of the plurality of data states $S_{N-x}$. The selected one of the plurality of data states $S_N$ corresponds to the threshold voltage of the memory cells being higher than for the earlier one of the plurality of data states $S_{N-x}$.

Again, the memory apparatus can further include a first data latch TDL configured to store a first status bit and a second data latch SDL configured to store a second status bit. Also, the strings are each coupled to one of a plurality of bit lines. Thus, the method can further includes the step of categorizing the memory cells using the first status bit and the second status bit. The method can also include the step of updating the first status bit and the second status bit based on sensing the memory cells targeted for the selected one of the plurality of data states $S_N$ identified as being faster to program than other ones of the memory cells targeted for the selected one of the plurality of data states $S_N$ during the one of the plurality of verify loops associated with the earlier one of the plurality of data states $S_{N-1}$.

As discussed above, each of the memory cells may be configured to store three bits. Thus, the plurality of data states includes, in order of the threshold voltage increasing in magnitude, an erased data state and a first data state and a second data state and a third data state and a fourth data state and a fifth data state and a sixth data state and a seventh data state (e.g., Erase, A, B, C, D, E, F and G in FIG. 11A). Accordingly, the plurality of program verify voltages includes a verify low reference voltage (e.g., VvaL, VvbL, and VvcL in FIG. 12A) and a verify high reference voltage (e.g., VvA, VvB, and VvC in FIG. 12A) for each of the plurality of data states. Again, the verify low reference voltage is lower in magnitude than the verify high reference voltage.

As mentioned, the first status bit and the second status bit define a plurality of latch states each corresponding to one of a plurality of bit line voltages. The plurality of latch states include, in order if increasing magnitude, a first latch state associated with the one of the plurality of bit line voltages being approximately zero volts and a second latch state associated with the one of the plurality of bit line voltages being a quick pass write bit line voltage Vqpw and a third latch state associated with the one of the plurality of bit line voltages being the quick pass write bit line voltage Vqpw plus a state look ahead quick pass write bit line voltage Vslaqpw and a fourth latch state associated with the one of the plurality of bit line voltages being a fully inhibited bit line voltage VDDSA. Thus, the method further includes the step of applying the one of the plurality of bit line voltages to each of the plurality of bit lines coupled to the memory cells being programmed in the program-verify operation depending on which of the plurality of latch states corresponds to the first status bit and the second status bit to adjust a programming speed of the memory cells being programmed while applying one of a plurality of program pulses of the program-verify operation.

Again, the state look ahead quick pass write process can be terminated based on an SPCV bitscan. Thus, the method can further include the step of identifying the memory cells targeted for the selected one of the plurality of data states $S_N$ as having the threshold voltage above the verify low reference voltage for the earlier one of the plurality of data states in a state look ahead quick pass write process. The method continues by counting a selected state look ahead quick pass write quantity of the memory cells targeted for the selected one of the plurality of data states $S_N$ identified as having the threshold voltage above the verify low reference voltage for the earlier one of the plurality of data states $S_{N-x}$ in the state look ahead quick pass write process. The next step of the method is determining whether the selected state look ahead quick pass write quantity is greater than a predetermined minimum selected state look ahead quick pass write off quantity in the state look ahead quick pass write process. The method continues with the step of terminating the state look ahead quick pass write process in response to determining the selected state look ahead quick pass write quantity is greater than the predetermined minimum selected state look ahead quick pass write off quantity.

According to other aspects and referring specifically to FIG. 22, the method further includes the step of 1404 starting the program-verify operation for a selected one of the plurality of data states $S_N$. Next, 1406 initializing the first status bit of the first data latch TDL as zero and the second status bit of the second data latch SDL as zero for the memory cells targeted for the selected one of the plurality of data states $S_N$. The method continues by 1408 applying one of the plurality of program pulses of the program-verify operation while applying one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed.

The method additionally includes the step of 1410 determining whether the one of the plurality of verify loops associated with the earlier one of the plurality of data states has been triggered. The next step of the method is 1412 (forward to 1430) determining whether another of the plurality of verify loops associated with the selected one of the plurality of data states $S_N$ using the verify low reference voltage and the verify high reference voltage for the selected one of the plurality of data states $S_N$ has been triggered in response to determining the one of the plurality of verify loops associated with the earlier one of the plurality of data states $S_{N-x}$ has not been triggered. The method also includes the step of 1414 determining whether a selected state look ahead quick pass write flag Sn_SLAQPW_flag equals one in response to determining the one of the plurality of verify loops associated with the earlier one of the plurality of data states $S_{N-x}$ has been triggered. Next, 1416 performing the one of the plurality of verify loops associated with the earlier one of the plurality of data states $S_{N-x}$ using the verify low reference voltage for the earlier one of the plurality of data states $S_{N-x}$ and sense the memory cells targeted for the selected one of the plurality of data states $S_N$ in response to determining the selected state look ahead quick pass write flag Sn_SLAQPW_flag does not equal one. The method continues with the step of 1418 (forward to 1430) determining whether the another of the plurality of verify loops associated with the selected one of the plurality of data states $S_N$ using the verify low reference voltage and the verify high reference voltage for the selected one of the plurality of data states $S_N$ has been triggered in response to determining the selected state look ahead quick pass write flag Sn_SLAQPW_flag equals one. The method continues by 1420 identifying the memory cells targeted for the selected one of the plurality of data states $S_N$ as having the threshold voltage above the verify low reference voltage for the earlier one of the plurality of data states $S_{N-x}$ and set the first status bit of the first data latch TDL as one and the second status bit of the second data latch SDL as zero for the memory cells targeted for the selected one of the plurality of data states $S_N$ identified as having the threshold voltage above the verify low reference voltage for the earlier one of the plurality of data states $S_{N-x}$. The method additionally includes the step of 1422 counting a selected state look ahead quick pass write quantity of the memory cells targeted for the selected one of the plurality of data states $S_N$ identified as having the threshold voltage above the verify low reference voltage for the earlier one of the plurality of data states $S_{N-x}$. The method also includes the step of 1424 determining whether the selected state look ahead quick pass write quantity is greater than a predetermined minimum selected state look ahead quick pass write off quantity. The next step of the method is 1426 (forward to 1430) determining whether another of the plurality of verify loops associated with the selected one of the plurality of data states $S_N$ using the verify low reference voltage and the verify high reference voltage for the selected one of the plurality of data states $S_N$ has been triggered in response to determining the selected state look ahead quick pass write quantity is not greater than the predetermined minimum selected state look ahead quick pass write off quantity. The method continues with the step of 1428 setting the selected state look ahead quick pass write flag Sn_SLAQPW_flag to be one in response to determining the selected state look ahead quick pass write quantity is greater than the predetermined minimum selected state look ahead quick pass write off quantity.

In addition, the method includes the step of 1430 determining whether the another of the plurality of verify loops associated with the selected one of the plurality of data states $S_N$ using the verify low reference voltage and the verify high reference voltage for the selected one of the plurality of data states $S_N$ has been triggered. The method continues by 1432 returning to 1408 applying one of the plurality of program pulses of the program-verify operation while applying one of the plurality of bit line voltages to each of the plurality of bit lines coupled to the memory cells being programmed in the program-verify operation according to the first status bit and the second status bit to adjust the programming speed of the memory cells being programmed in response to determining the another of the plurality of verify loops associated with the selected one of the plurality of data states $S_N$ has not been triggered. The method also includes the step of 1434 performing another of the plurality of verify loops associated with the selected one of the plurality of data states $S_N$ using the verify low reference voltage and the verify high reference voltage for the selected one of the plurality of data states $S_N$ and sense the memory cells targeted for the selected one of the plurality of data states $S_N$ in response to determining the another of the plurality of verify loops associated with the selected one of the plurality of data states $S_N$ has been triggered. In addition, the method includes the step of 1436 identifying the memory cells targeted for the selected one of the plurality of data states $S_N$ as having the threshold voltage above the verify high reference voltage for the selected one of the plurality of data states $S_N$ and set the first status bit of the first data latch TDL as one and the second status bit of the second data latch SDL as one for the memory cells targeted for the selected one of the plurality of data states $S_N$ having the threshold voltage above the verify high reference voltage for the selected one of the plurality of data states $S_N$. The next step of the method is 1438 identifying the memory cells targeted for the selected one of the plurality of data states $S_N$ as having the threshold voltage above the verify low reference voltage for the selected one of the plurality of data states $S_N$ and set the first status bit of the first data latch TDL as one and the second status bit of the second data latch SDL as zero in response to the first status bit being one and the second status bit being zero and set the first status bit of the first data latch TDL as zero and the second status bit of the second data latch SDL as one in response to the first status bit being one and the second status bit being zero for the memory cells targeted for the selected one of the plurality of data states $S_N$ having the threshold voltage above the verify low reference voltage for the selected one of the plurality of data states $S_N$ while not exceeding the verify high reference voltage for the selected one of the plurality of data states $S_N$.

The method additionally includes the step of 1440 counting a selected state verify high quantity of the memory cells targeted for the selected one of the plurality of data states $S_N$ identified as having the threshold voltage above the verify high reference voltage for the selected one of the plurality of data states $S_N$. The method continues with the step of 1442 determining whether the selected state verify high quantity is less than a predetermined minimum selected state verify high on quantity. Next, 1444 returning to 1408 applying the one of the plurality of program pulses of the program-verify operation while applying the one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed in response to the selected state verify high quantity not being less than the predetermined minimum selected state verify high on quantity. The method also includes the step of 1446 ending the program operation in response to the selected state verify high quantity being less than the predetermined minimum selected state verify high on quantity.

In the flow chart of FIG. 22, program pulse #m is defined as P_#m and $S_N$ indicates TLC state (N=0, 1, . . . , 7). Normally, post one TLC program pulse, several states will perform verify in sequence. Smart verify operation is not shown to simplify the chart. The verify of $S_1$ is starting after the first P_#1 and the triggering of verify of S2-S7 is determined by SPCV. In addition, QPW contributes to a tight VT distribution. During default TLC QPW, the verify of S1-S6 is with QPW while the verify of S7 is without QPW.

As shown in the exemplary flow of $S_x$LAQPW, in order to tighten the NVT of the selected one of the plurality of data states $S_N$, $S_N$ bits will be sensed by SLA early sensing with $VL_{n-x}$ level in advance. As the fast bit of the selected one of the plurality of data states $S_N$ passing the $VL_{N-x}$ level, its "TDL & SDL" will be set as "TDL=1 & SDL=0" and then Vqpw will be applied on its bit line in next program pulse for compaction of the selected one of the plurality of data states $S_N$. When these $VL_{n-x}$ detected cells of the selected one of the plurality of data states $S_N$ is later detected by $VL_{n-x}$, its "TDL & SDL" will be set as "TDL=0 & SDL=1" and then next program pulse will apply Vqpw+Vslaqpw on its bit line to slow down the "$S_x$LAQPW+QPW" $S_N$ bits. The SLA early sensing operation of $S_x$LAQPW will not induce additional program time tProg since the sensing of $S_N$ can be performed synchronously with the default $VL_{n-x}$ sensing.

In the $S_x$LAQPW flow chart of FIG. 22, the selected state look ahead quick pass write flag Sn_SLAQPW_flag is to determine whether terminate the SLA early sensing for upcoming $S_N$. The termination of the SLA early sensing on $S_N$ can avoid the slowing down of $S_N$ normal bits. During TLC program, Sn_SLAQPW_flag will be initialized as 0. As $S_N$ SPCV FBC>=$S_x$LAQPW_BSPF, Sn_SLAQPW_flag will set as high (selected state look ahead quick pass write flag Sn_SLAQPW_flag=1). Then, $S_N$ bits will not be sensed by SLA early sensing with $VL_{n-x}$ level again. Otherwise, selected state look ahead quick pass write flag Sn_SLAQPW_flag will keep as low (selected state look ahead quick pass write flag Sn_SLAQPW_flag=0) and then $S_N$ bits will be sensed by SLA early sensing with $VL_{n-x}$ level successively in the following pulse.

Again, the trigger for the one of the plurality of verify loops associated with the earlier one of the plurality of data states can be determined by SPCV. Similarly, the trigger for the another of the plurality of verify loops associated with the selected one of the plurality of data states $S_N$ using the verify low reference voltage and the verify high reference voltage for the selected one of the plurality of data states $S_N$ can be determined by a bitscan using the verify high reference voltage for the selected one of the plurality of data states $S_N$. Thus, the method further includes the step of determining whether the one of the plurality of verify loops associated with the earlier one of the plurality of data states $S_{N-x}$ has been triggered based on an even earlier bitscan count of the memory cells associated with an even earlier one of the plurality of data states $S_{N-x-1}$ having the threshold voltage exceeding an even earlier verify level for the even earlier one of the plurality of data states $S_{N-x-1}$ exceeding a predetermined even earlier bitscan threshold. The even earlier one of the plurality of data states $S_{N-x-1}$ corresponds to the threshold voltage of the memory cells being lower than for the earlier one of the plurality of data states $S_{N-x}$. The method also includes the step of determining whether the another of the plurality of verify loops associated with the selected one of the plurality of data states using the verify low reference voltage and the verify high reference voltage for the selected one of the plurality of data states $S_N$ has been triggered based on an earlier bitscan count of the memory cells associated with the earlier one of the plurality of data states $S_{N-x}$ having the threshold voltage exceeding the verify high reference voltage for the earlier one of the plurality of data states $S_{N-x}$ exceeding a predetermined earlier bitscan threshold.

The advantages of the memory apparatus and method disclosed herein include shortening the program time tProg by reducing total number of verify pulses. Using the state look ahead quick pass write (SLAQPW) algorithm described above, a tightened natural threshold voltage VT for upcoming states (i.e., the selected one of the plurality of data states) can be obtained by slowing down the fast bits of the selected one of the plurality of data states $S_N$ in advance (before the triggering of its verify pulse). In the described SLAQPW algorithm, the SLA early sensing of the selected one of the plurality of data states $S_N$ is based on default verify for an earlier one of the plurality of data states $S_{N-x}$ without additional verify pulses. As a result, some verify pulses for each of the plurality of data states are certain to be skipped, reducing program time tProg and improving device performance.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
memory cells each connected to one of a plurality of word lines and disposed in strings and configured to retain a threshold voltage corresponding to one of a plurality of data states; and
a control means coupled to the plurality of word lines and the strings and configured to:
apply verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation, and
slow the memory cells targeted for a selected one of the plurality of data states identified as being faster to program than other ones of the memory cells targeted for the selected one of the plurality of data states during one of the plurality of verify loops associated with an earlier one of the plurality of data states, the selected one of the plurality of data states corresponding to the threshold voltage of the memory cells being higher than for the earlier one of the plurality of data states.

2. The memory apparatus as set forth in claim 1, further including a first data latch configured to store a first status bit and a second data latch configured to store a second status bit and wherein the strings are each coupled to one of a plurality of bit lines and the control means is further configured to:
  categorize the memory cells using the first status bit and the second status bit; and
  update the first status bit and the second status bit based on sensing the memory cells targeted for the selected one of the plurality of data states identified as being faster to program than other ones of the memory cells targeted for the selected one of the plurality of data states during the one of the plurality of verify loops associated with the earlier one of the plurality of data states.

3. The memory apparatus as set forth in claim 2, wherein each of the memory cells is configured to store three bits, the plurality of data states includes, in order of the threshold voltage increasing in magnitude, an erased data state and a first data state and a second data state and a third data state and a fourth data state and a fifth data state and a sixth data state and a seventh data state, the plurality of program verify voltages includes a verify low reference voltage and a verify high reference voltage for each of the plurality of data states, the verify low reference voltage being lower in magnitude than the verify high reference voltage.

4. The memory apparatus as set forth in claim 3, wherein the first status bit and the second status bit define a plurality of latch states each corresponding to one of a plurality of bit line voltages, the plurality of latch states include, in order if increasing magnitude, a first latch state associated with the one of the plurality of bit line voltages being approximately zero volts and a second latch state associated with the one of the plurality of bit line voltages being a quick pass write bit line voltage and a third latch state associated with the one of the plurality of bit line voltages being the quick pass write bit line voltage plus a state look ahead quick pass write bit line voltage and a fourth latch state associated with the one of the plurality of bit line voltages being a fully inhibited bit line voltage and the control means is configured to apply the one of the plurality of bit line voltages to each of the plurality of bit lines coupled to the memory cells being programmed in the program-verify operation depending on which of the plurality of latch states corresponds to the first status bit and the second status bit to adjust a programming speed of the memory cells being programmed while applying one of a plurality of program pulses of the program-verify operation.

5. The memory apparatus as set forth in claim 4, wherein the control means is further configured to:
  identify the memory cells targeted for the selected one of the plurality of data states as having the threshold voltage above the verify low reference voltage for the earlier one of the plurality of data states in a state look ahead quick pass write process;
  count a selected state look ahead quick pass write quantity of the memory cells targeted for the selected one of the plurality of data states identified as having the threshold voltage above the verify low reference voltage for the earlier one of the plurality of data states in the state look ahead quick pass write process;
  determine whether the selected state look ahead quick pass write quantity is greater than a predetermined minimum selected state look ahead quick pass write off quantity in the state look ahead quick pass write process; and
  terminate the state look ahead quick pass write process in response to determining the selected state look ahead quick pass write quantity is greater than the predetermined minimum selected state look ahead quick pass write off quantity.

6. The memory apparatus as set forth in claim 4, wherein the control means is further configured to:
  start the program-verify operation for a selected one of the plurality of data states;
  initialize the first status bit of the first data latch as zero and the second status bit of the second data latch as zero for the memory cells targeted for the selected one of the plurality of data states;
  apply one of the plurality of program pulses of the program-verify operation while applying one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed;
  determine whether the one of the plurality of verify loops associated with the earlier one of the plurality of data states has been triggered;
  determine whether another of the plurality of verify loops associated with the selected one of the plurality of data states using the verify low reference voltage and the verify high reference voltage for the selected one of the plurality of data states has been triggered in response to determining the one of the plurality of verify loops associated with the earlier one of the plurality of data states has not been triggered;
  determine whether a selected state look ahead quick pass write flag equals one in response to determining the one of the plurality of verify loops associated with the earlier one of the plurality of data states has been triggered;
  perform the one of the plurality of verify loops associated with the earlier one of the plurality of data states using the verify low reference voltage for the earlier one of the plurality of data states and sense the memory cells targeted for the selected one of the plurality of data states in response to determining the selected state look ahead quick pass write flag does not equal one;
  determine whether the another of the plurality of verify loops associated with the selected one of the plurality of data states using the verify low reference voltage and the verify high reference voltage for the selected one of the plurality of data states has been triggered in response to determining the selected state look ahead quick pass write flag equals one;
  identify the memory cells targeted for the selected one of the plurality of data states as having the threshold voltage above the verify low reference voltage for the earlier one of the plurality of data states and set the first status bit of the first data latch as one and the second status bit of the second data latch as zero for the memory cells targeted for the selected one of the plurality of data states identified as having the threshold voltage above the verify low reference voltage for the earlier one of the plurality of data states;

count a selected state look ahead quick pass write quantity of the memory cells targeted for the selected one of the plurality of data states identified as having the threshold voltage above the verify low reference voltage for the earlier one of the plurality of data states;

determine whether the selected state look ahead quick pass write quantity is greater than a predetermined minimum selected state look ahead quick pass write off quantity;

determine whether the another of the plurality of verify loops associated with the selected one of the plurality of data states using the verify low reference voltage and the verify high reference voltage for the selected one of the plurality of data states has been triggered in response to determining the selected state look ahead quick pass write quantity is not greater than the predetermined minimum selected state look ahead quick pass write off quantity;

set the selected state look ahead quick pass write flag to be one in response to determining the selected state look ahead quick pass write quantity is greater than the predetermined minimum selected state look ahead quick pass write off quantity;

determine whether the another of the plurality of verify loops associated with the selected one of the plurality of data states using the verify low reference voltage and the verify high reference voltage for the selected one of the plurality of data states has been triggered;

return to apply one of the plurality of program pulses of the program-verify operation while applying one of the plurality of bit line voltages to each of the plurality of bit lines coupled to the memory cells being programmed in the program-verify operation according to the first status bit and the second status bit to adjust the programming speed of the memory cells being programmed in response to determining the another of the plurality of verify loops associated with the selected one of the plurality of data states has not been triggered;

perform another of the plurality of verify loops associated with the selected one of the plurality of data states using the verify low reference voltage and the verify high reference voltage for the selected one of the plurality of data states and sense the memory cells targeted for the selected one of the plurality of data states in response to determining the another of the plurality of verify loops associated with the selected one of the plurality of data states has been triggered;

identify the memory cells targeted for the selected one of the plurality of data states as having the threshold voltage above the verify high reference voltage for the selected one of the plurality of data states and set the first status bit of the first data latch as one and the second status bit of the second data latch as one for the memory cells targeted for the selected one of the plurality of data states having the threshold voltage above the verify high reference voltage for the selected one of the plurality of data states;

identify the memory cells targeted for the selected one of the plurality of data states as having the threshold voltage above the verify low reference voltage for the selected one of the plurality of data states and set the first status bit of the first data latch as one and the second status bit of the second data latch as zero in response to the first status bit being one and the second status bit being zero and set the first status bit of the first data latch as zero and the second status bit of the second data latch as one in response to the first status bit being one and the second status bit being zero for the memory cells targeted for the selected one of the plurality of data states having the threshold voltage above the verify low reference voltage for the selected one of the plurality of data states while not exceeding the verify high reference voltage for the selected one of the plurality of data states;

count a selected state verify high quantity of the memory cells targeted for the selected one of the plurality of data states identified as having the threshold voltage above the verify high reference voltage for the selected one of the plurality of data states;

determine whether the selected state verify high quantity is less than a predetermined minimum selected state verify high on quantity;

return to apply the one of the plurality of program pulses of the program-verify operation while applying the one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed in response to the selected state verify high quantity not being less than the predetermined minimum selected state verify high on quantity; and end the program operation in response to the selected state verify high quantity being less than the predetermined minimum selected state verify high on quantity.

7. The memory apparatus as set forth in claim 6, wherein the control means is further configured to:

determine whether the one of the plurality of verify loops associated with the earlier one of the plurality of data states has been triggered based on an even earlier bitscan count of the memory cells associated with an even earlier one of the plurality of data states having the threshold voltage exceeding an even earlier verify level for the even earlier one of the plurality of data states exceeding a predetermined even earlier bitscan threshold, the even earlier one of the plurality of data states corresponding to the threshold voltage of the memory cells being lower than for the earlier one of the plurality of data states; and determine whether the another of the plurality of verify loops associated with the selected one of the plurality of data states using the verify low reference voltage and the verify high reference voltage for the selected one of the plurality of data states has been triggered based on an earlier bitscan count of the memory cells associated with the earlier one of the plurality of data states having the threshold voltage exceeding the verify high reference voltage for the earlier one of the plurality of data states exceeding a predetermined earlier bitscan threshold.

8. A controller in communication with a memory apparatus including memory cells each connected to one of a plurality of word lines and disposed in strings and configured to retain a threshold voltage corresponding to one of a plurality of data states, the controller configured to:

instruct the memory apparatus to apply verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation; and instruct the memory apparatus to slow the memory cells targeted for a selected one of the plurality of data states identified as being faster to program than other ones of the memory cells targeted for the selected one of the plurality of data states during one of the plurality of verify loops associated with an earlier one of the plurality of data states, the selected one of the plurality of data states corresponding to the threshold voltage of the memory cells being higher than for the earlier one of the plurality of data states.

9. The controller as set forth in claim 8, wherein the memory apparatus further includes a first data latch configured to store a first status bit and a second data latch configured to store a second status bit and wherein the strings are each coupled to one of a plurality of bit lines and the controller is further configured to:

categorize the memory cells using the first status bit and the second status bit; and update the first status bit and the second status bit based on sensing the memory cells targeted for the selected one of the plurality of data states identified as being faster to program than other ones of the memory cells targeted for the selected one of the plurality of data states during the one of the plurality of verify loops associated with the earlier one of the plurality of data states.

10. The controller as set forth in claim 9, wherein each of the memory cells is configured to store three bits, the plurality of data states includes, in order of the threshold voltage increasing in magnitude, an erased data state and a first data state and a second data state and a third data state and a fourth data state and a fifth data state and a sixth data state and a seventh data state, the plurality of program verify voltages includes a verify low reference voltage and a verify high reference voltage for each of the plurality of data states, the verify low reference voltage being lower in magnitude than the verify high reference voltage.

11. The controller as set forth in claim 10, wherein the first status bit and the second status bit define a plurality of latch states each corresponding to one of a plurality of bit line voltages, the plurality of latch states include, in order if increasing magnitude, a first latch state associated with the one of the plurality of bit line voltages being approximately zero volts and a second latch state associated with the one of the plurality of bit line voltages being a quick pass write bit line voltage and a third latch state associated with the one of the plurality of bit line voltages being the quick pass write bit line voltage plus a state look ahead quick pass write bit line voltage and a fourth latch state associated with the one of the plurality of bit line voltages being a fully inhibited bit line voltage and the controller is configured to apply the one of the plurality of bit line voltages to each of the plurality of bit lines coupled to the memory cells being programmed in the program-verify operation depending on which of the plurality of latch states corresponds to the first status bit and the second status bit to adjust a programming speed of the memory cells being programmed while applying one of a plurality of program pulses of the program-verify operation.

12. The controller as set forth in claim 11, wherein the controller is further configured to:

instruct the memory apparatus to identify the memory cells targeted for the selected one of the plurality of data states as having the threshold voltage above the verify low reference voltage for the earlier one of the plurality of data states in a state look ahead quick pass write process;

instruct the memory apparatus to count a selected state look ahead quick pass write quantity of the memory cells targeted for the selected one of the plurality of data states identified as having the threshold voltage above the verify low reference voltage for the earlier one of the plurality of data states in the state look ahead quick pass write process;

determine whether the selected state look ahead quick pass write quantity is greater than a predetermined minimum selected state look ahead quick pass write off quantity in the state look ahead quick pass write process; and terminate the state look ahead quick pass write process in response to determining the selected state look ahead quick pass write quantity is greater than the predetermined minimum selected state look ahead quick pass write off quantity.

13. The controller as set forth in claim 11, wherein the controller is further configured to:

instruct the memory apparatus to start the program-verify operation for a selected one of the plurality of data states;

initialize the first status bit of the first data latch as zero and the second status bit of the second data latch as zero for the memory cells targeted for the selected one of the plurality of data states;

instruct the memory apparatus to apply one of the plurality of program pulses of the program-verify operation while applying one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed;

determine whether the one of the plurality of verify loops associated with the earlier one of the plurality of data states has been triggered;

determine whether another of the plurality of verify loops associated with the selected one of the plurality of data states using the verify low reference voltage and the verify high reference voltage for the selected one of the plurality of data states has been triggered in response to determining the one of the plurality of verify loops associated with the earlier one of the plurality of data states has not been triggered;

determine whether a selected state look ahead quick pass write flag equals one in response to determining the one of the plurality of verify loops associated with the earlier one of the plurality of data states has been triggered;

instruct the memory apparatus to perform the one of the plurality of verify loops associated with the earlier one of the plurality of data states using the verify low reference voltage for the earlier one of the plurality of data states and sense the memory cells targeted for the selected one of the plurality of data states in response to determining the selected state look ahead quick pass write flag does not equal one;

determine whether the another of the plurality of verify loops associated with the selected one of the plurality of data states using the verify low reference voltage and the verify high reference voltage for the selected one of the plurality of data states has been triggered in response to determining the selected state look ahead quick pass write flag equals one;
instruct the memory apparatus to identify the memory cells targeted for the selected one of the plurality of data states as having the threshold voltage above the verify low reference voltage for the earlier one of the plurality of data states and set the first status bit of the first data latch as one and the second status bit of the second data latch as zero for the memory cells targeted for the selected one of the plurality of data states identified as having the threshold voltage above the verify low reference voltage for the earlier one of the plurality of data states;
instruct the memory apparatus to count a selected state look ahead quick pass write quantity of the memory cells targeted for the selected one of the plurality of data states identified as having the threshold voltage above the verify low reference voltage for the earlier one of the plurality of data states;
determine whether the selected state look ahead quick pass write quantity is greater than a predetermined minimum selected state look ahead quick pass write off quantity;
determine whether the another of the plurality of verify loops associated with the selected one of the plurality of data states using the verify low reference voltage and the verify high reference voltage for the selected one of the plurality of data states has been triggered in response to determining the selected state look ahead quick pass write quantity is not greater than the predetermined minimum selected state look ahead quick pass write off quantity;
set the selected state look ahead quick pass write flag to be one in response to determining the selected state look ahead quick pass write quantity is greater than the predetermined minimum selected state look ahead quick pass write off quantity;
determine whether the another of the plurality of verify loops associated with the selected one of the plurality of data states using the verify low reference voltage and the verify high reference voltage for the selected one of the plurality of data states has been triggered;
return to instruct the memory apparatus to apply one of the plurality of program pulses of the program-verify operation while applying one of the plurality of bit line voltages to each of the plurality of bit lines coupled to the memory cells being programmed in the program-verify operation according to the first status bit and the second status bit to adjust the programming speed of the memory cells being programmed in response to determining the another of the plurality of verify loops associated with the selected one of the plurality of data states has not been triggered;
instruct the memory apparatus to perform another of the plurality of verify loops associated with the selected one of the plurality of data states using the verify low reference voltage and the verify high reference voltage for the selected one of the plurality of data states and sense the memory cells targeted for the selected one of the plurality of data states in response to determining the another of the plurality of verify loops associated with the selected one of the plurality of data states has been triggered;
instruct the memory apparatus to identify the memory cells targeted for the selected one of the plurality of data states as having the threshold voltage above the verify high reference voltage for the selected one of the plurality of data states and set the first status bit of the first data latch as one and the second status bit of the second data latch as one for the memory cells targeted for the selected one of the plurality of data states having the threshold voltage above the verify high reference voltage for the selected one of the plurality of data states;
instruct the memory apparatus to identify the memory cells targeted for the selected one of the plurality of data states as having the threshold voltage above the verify low reference voltage for the selected one of the plurality of data states and set the first status bit of the first data latch as one and the second status bit of the second data latch as zero in response to the first status bit being one and the second status bit being zero and set the first status bit of the first data latch as zero and the second status bit of the second data latch as one in response to the first status bit being one and the second status bit being zero for the memory cells targeted for the selected one of the plurality of data states having the threshold voltage above the verify low reference voltage for the selected one of the plurality of data states while not exceeding the verify high reference voltage for the selected one of the plurality of data states;
instruct the memory apparatus to count a selected state verify high quantity of the memory cells targeted for the selected one of the plurality of data states identified as having the threshold voltage above the verify high reference voltage for the selected one of the plurality of data states;
determine whether the selected state verify high quantity is less than a predetermined minimum selected state verify high on quantity;
return to instruct the memory apparatus to apply the one of the plurality of program pulses of the program-verify operation while applying the one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed in response to the selected state verify high quantity not being less than the predetermined minimum selected state verify high on quantity; and
end the program operation in response to the selected state verify high quantity being less than the predetermined minimum selected state verify high on quantity.

14. A method of operating a memory apparatus including memory cells each connected to one of a plurality of word lines and disposed in strings and configured to retain a threshold voltage corresponding to one of a plurality of data states, the method comprising the steps of:
applying verification pulses of a plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed during each of a plurality of verify loops of a program-verify operation; and
slowing the memory cells targeted for a selected one of the plurality of data states identified as being faster to program than other ones of the memory cells targeted for the selected one of the plurality of data states during one of the plurality of verify loops associated with an earlier one of the plurality of data states, the selected one of the plurality of data states corresponding to the threshold voltage of the memory cells being higher than for the earlier one of the plurality of data states.

15. The method as set forth in claim 14, wherein the memory apparatus further includes a first data latch configured to store a first status bit and a second data latch configured to store a second status bit and wherein the strings are each coupled to one of a plurality of bit lines and the method further includes the steps of:
   categorizing the memory cells using the first status bit and the second status bit; and
   updating the first status bit and the second status bit based on sensing the memory cells targeted for the selected one of the plurality of data states identified as being faster to program than other ones of the memory cells targeted for the selected one of the plurality of data states during the one of the plurality of verify loops associated with the earlier one of the plurality of data states.

16. The method as set forth in claim 15, wherein each of the memory cells is configured to store three bits, the plurality of data states includes, in order of the threshold voltage increasing in magnitude, an erased data state and a first data state and a second data state and a third data state and a fourth data state and a fifth data state and a sixth data state and a seventh data state, the plurality of program verify voltages includes a verify low reference voltage and a verify high reference voltage for each of the plurality of data states, the verify low reference voltage being lower in magnitude than the verify high reference voltage.

17. The method as set forth in claim 16, wherein the first status bit and the second status bit define a plurality of latch states each corresponding to one of a plurality of bit line voltages, the plurality of latch states include, in order if increasing magnitude, a first latch state associated with the one of the plurality of bit line voltages being approximately zero volts and a second latch state associated with the one of the plurality of bit line voltages being a quick pass write bit line voltage and a third latch state associated with the one of the plurality of bit line voltages being the quick pass write bit line voltage plus a state look ahead quick pass write bit line voltage and a fourth latch state associated with the one of the plurality of bit line voltages being a fully inhibited bit line voltage and the method further includes the step of applying the one of the plurality of bit line voltages to each of the plurality of bit lines coupled to the memory cells being programmed in the program-verify operation depending on which of the plurality of latch states corresponds to the first status bit and the second status bit to adjust a programming speed of the memory cells being programmed while applying one of a plurality of program pulses of the program-verify operation.

18. The method as set forth in claim 17, further including the steps of:
   identifying the memory cells targeted for the selected one of the plurality of data states as having the threshold voltage above the verify low reference voltage for the earlier one of the plurality of data states in a state look ahead quick pass write process;
   counting a selected state look ahead quick pass write quantity of the memory cells targeted for the selected one of the plurality of data states identified as having the threshold voltage above the verify low reference voltage for the earlier one of the plurality of data states in the state look ahead quick pass write process;
   determining whether the selected state look ahead quick pass write quantity is greater than a predetermined minimum selected state look ahead quick pass write off quantity in the state look ahead quick pass write process; and
   terminating the state look ahead quick pass write process in response to determining the selected state look ahead quick pass write quantity is greater than the predetermined minimum selected state look ahead quick pass write off quantity.

19. The method as set forth in claim 17, further including the steps of:
   starting the program-verify operation for a selected one of the plurality of data states;
   initializing the first status bit of the first data latch as zero and the second status bit of the second data latch as zero for the memory cells targeted for the selected one of the plurality of data states;
   applying one of the plurality of program pulses of the program-verify operation while applying one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed;
   determining whether the one of the plurality of verify loops associated with the earlier one of the plurality of data states has been triggered;
   determining whether another of the plurality of verify loops associated with the selected one of the plurality of data states using the verify low reference voltage and the verify high reference voltage for the selected one of the plurality of data states has been triggered in response to determining the one of the plurality of verify loops associated with the earlier one of the plurality of data states has not been triggered;
   determining whether a selected state look ahead quick pass write flag equals one in response to determining the one of the plurality of verify loops associated with the earlier one of the plurality of data states has been triggered;
   performing the one of the plurality of verify loops associated with the earlier one of the plurality of data states using the verify low reference voltage for the earlier one of the plurality of data states and sense the memory cells targeted for the selected one of the plurality of data states in response to determining the selected state look ahead quick pass write flag does not equal one;
   determining whether the another of the plurality of verify loops associated with the selected one of the plurality of data states using the verify low reference voltage and the verify high reference voltage for the selected one of the plurality of data states has been triggered in response to determining the selected state look ahead quick pass write flag equals one;
   identifying the memory cells targeted for the selected one of the plurality of data states as having the threshold voltage above the verify low reference voltage for the earlier one of the plurality of data states and set the first status bit of the first data latch as one and the second status bit of the second data latch as zero for the memory cells targeted for the selected one of the plurality of data states identified as having the threshold voltage above the verify low reference voltage for the earlier one of the plurality of data states;

counting a selected state look ahead quick pass write quantity of the memory cells targeted for the selected one of the plurality of data states identified as having the threshold voltage above the verify low reference voltage for the earlier one of the plurality of data states;

determining whether the selected state look ahead quick pass write quantity is greater than a predetermined minimum selected state look ahead quick pass write off quantity;

determining whether the another of the plurality of verify loops associated with the selected one of the plurality of data states using the verify low reference voltage and the verify high reference voltage for the selected one of the plurality of data states has been triggered in response to determining the selected state look ahead quick pass write quantity is not greater than the predetermined minimum selected state look ahead quick pass write off quantity;

setting the selected state look ahead quick pass write flag to be one in response to determining the selected state look ahead quick pass write quantity is greater than the predetermined minimum selected state look ahead quick pass write off quantity;

determining whether the another of the plurality of verify loops associated with the selected one of the plurality of data states using the verify low reference voltage and the verify high reference voltage for the selected one of the plurality of data states has been triggered;

returning to applying one of the plurality of program pulses of the program-verify operation while applying one of the plurality of bit line voltages to each of the plurality of bit lines coupled to the memory cells being programmed in the program-verify operation according to the first status bit and the second status bit to adjust the programming speed of the memory cells being programmed in response to determining the another of the plurality of verify loops associated with the selected one of the plurality of data states has not been triggered;

performing another of the plurality of verify loops associated with the selected one of the plurality of data states using the verify low reference voltage and the verify high reference voltage for the selected one of the plurality of data states and sense the memory cells targeted for the selected one of the plurality of data states in response to determining the another of the plurality of verify loops associated with the selected one of the plurality of data states has been triggered;

identifying the memory cells targeted for the selected one of the plurality of data states as having the threshold voltage above the verify high reference voltage for the selected one of the plurality of data states and set the first status bit of the first data latch as one and the second status bit of the second data latch as one for the memory cells targeted for the selected one of the plurality of data states having the threshold voltage above the verify high reference voltage for the selected one of the plurality of data states;

identifying the memory cells targeted for the selected one of the plurality of data states as having the threshold voltage above the verify low reference voltage for the selected one of the plurality of data states and set the first status bit of the first data latch as one and the second status bit of the second data latch as zero in response to the first status bit being one and the second status bit being zero and set the first status bit of the first data latch as zero and the second status bit of the second data latch as one in response to the first status bit being one and the second status bit being zero for the memory cells targeted for the selected one of the plurality of data states having the threshold voltage above the verify low reference voltage for the selected one of the plurality of data states while not exceeding the verify high reference voltage for the selected one of the plurality of data states;

counting a selected state verify high quantity of the memory cells targeted for the selected one of the plurality of data states identified as having the threshold voltage above the verify high reference voltage for the selected one of the plurality of data states;

determining whether the selected state verify high quantity is less than a predetermined minimum selected state verify high on quantity;

returning to applying the one of the plurality of program pulses of the program-verify operation while applying the one of the plurality of bit line voltages to each of the plurality of bit lines coupled to the memory cells being programmed in the program-verify operation depending on which of the plurality of latch states corresponds to the first status bit and the second status bit to adjust the programming speed of the memory cells being programmed in response to the selected state verify high quantity not being less than the predetermined minimum selected state verify high on quantity; and ending the program operation in response to the selected state verify high quantity being less than the predetermined minimum selected state verify high on quantity.

20. The method as set forth in claim 19, further including the steps of:

determining whether the one of the plurality of verify loops associated with the earlier one of the plurality of data states has been triggered based on an even earlier bitscan count of the memory cells associated with an even earlier one of the plurality of data states having the threshold voltage exceeding an even earlier verify level for the even earlier one of the plurality of data states exceeding a predetermined even earlier bitscan threshold, the even earlier one of the plurality of data states corresponding to the threshold voltage of the memory cells being lower than for the earlier one of the plurality of data states; and determining whether the another of the plurality of verify loops associated with the selected one of the plurality of data states using the verify low reference voltage and the verify high reference voltage for the selected one of the plurality of data states has been triggered based on an earlier bitscan count of the memory cells associated with the earlier one of the plurality of data states having the threshold voltage exceeding the verify high reference voltage for the earlier one of the plurality of data states exceeding a predetermined earlier bitscan threshold.

* * * * *